(12) United States Patent
Shiba

(10) Patent No.: US 7,678,649 B2
(45) Date of Patent: Mar. 16, 2010

(54) SEMICONDUCTOR DEVICE AND MANUFACTURING METHOD THEREOF

(75) Inventor: Kazuyoshi Shiba, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/330,637

(22) Filed: Dec. 9, 2008

(65) Prior Publication Data

US 2009/0093096 A1 Apr. 9, 2009

Related U.S. Application Data

(62) Division of application No. 10/592,169, filed as application No. PCT/JP2005/004750 on Mar. 17, 2005, now Pat. No. 7,612,402.

(30) Foreign Application Priority Data

Apr. 14, 2004 (JP) ............................... 2004-119415

(51) Int. Cl.
*H01L 21/336* (2006.01)
(52) U.S. Cl. ...................... 438/257; 438/275
(58) Field of Classification Search .................. 438/257, 438/275, 171; 257/E27.071
See application file for complete search history.

(56) References Cited

U.S. PATENT DOCUMENTS

| | | | |
|---|---|---|---|
| 5,457,335 A | 10/1995 | Kuroda et al. | |
| 5,612,238 A | 3/1997 | Sato et al. | |
| 6,489,650 B2 | 12/2002 | Kumazaki | |
| 6,501,689 B2 | 12/2002 | Kuroda et al. | |
| 6,849,490 B2 | 2/2005 | Hayashi | |
| 2001/0048130 A1 | 12/2001 | Hayashi | |
| 2003/0047747 A1 | 3/2003 | Kumazaki | |
| 2004/0014323 A1 | 1/2004 | Shimizu | |
| 2005/0173753 A1* | 8/2005 | Kim et al. .................. | 257/315 |

FOREIGN PATENT DOCUMENTS

| | | |
|---|---|---|
| JP | 4-212471 A | 8/1992 |
| JP | 7-235613 A | 9/1995 |
| JP | 9-289249 A | 11/1997 |
| JP | 11-87664 A | 3/1999 |
| JP | 2001-196327 A | 7/2001 |
| JP | 2001-332640 A | 11/2001 |
| JP | 2004-55826 A | 2/2004 |
| JP | 2004-79893 A | 3/2004 |

* cited by examiner

*Primary Examiner*—Phat X Cao
(74) *Attorney, Agent, or Firm*—Miles & Stockbridge P.C.

(57) ABSTRACT

To provide a nonvolatile memory having an excellent data holding property and a technique for manufacturing the memory, a polycrystalline silicon film 7 and an insulating film 8 are sequentially stacked on a gate insulating film 6, then the polycrystalline silicon film 7 and the insulating film 8 are patterned to form gate electrodes 7A, 7B, and then sidewall spacers 12 including a silicon oxide film are formed on sidewalls of the gate electrodes 7A, 7B. After that, a silicon nitride film 19 is deposited on a substrate 1 by a plasma enhanced CVD process so that the gate electrodes 7A, 7B are not directly contacted to the silicon nitride film 19.

15 Claims, 54 Drawing Sheets

SEMICONDUCTOR DEVICE AND MANUFACTURING METHOD THEREOF

CROSS-REFERENCE TO RELATED APPLICATION

This application is a division of application Ser. No. 10/592,169 filed Oct. 11, 2006, now U.S. Pat. No. 7,612,402 which is a 371 of International Patent Application No. PCT/JP2005/004750 filed Mar. 17, 2005.

TECHNICAL FIELD

The present invention relates to a semiconductor device and a method of manufacturing the device, and particularly relates to a technique effectively used for a semiconductor device having a nonvolatile memory such as flash-EEPROM (Electric Erasable Programmable Read Only Memory; hereinafter mentioned as flash memory).

BACKGROUND ART

For example, there is a technique of manufacturing a semiconductor device (for example, refer to patent literature 1), in which a gate electrode pattern is formed by stacking a gate oxide film, a gate electrode, and an offset oxide film from a lower layer on a silicon substrate; then sidewalls are formed on sidewalls of the gate electrode pattern and then the offset oxide film is subjected to etching; then the silicon substrate is subjected to ion implantation of an impurity for activation, thereby an impurity diffusion layer is formed while conductivity of the gate electrode is increased at the same time, so that surface areas of the gate electrode and the impurity diffusion layer are formed into silicide, and then an insulating film for covering the areas is formed; then the insulating film is subjected to etching such that the film is remained while filling spaces between the sidewalls, but not remained on the silicide formed on the surface areas of the impurity diffusion layer; then a SiN film and an interlayer insulating film are sequentially formed in a manner of covering the insulating film between the sidewalls; and then a contact hole penetrated to the impurity diffusion layer is formed in the interlayer insulating film; thereby a silicide technique and a SAC (Self Align Contact) technique are preformed as a series of processes, consequently high speed and a high degree of integration are achieved.

[Patent Literature 1]
JP-A-9-289249.

DISCLOSURE OF THE INVENTION

The inventor has investigated a technique of forming a nonvolatile memory without adding a different process to a manufacturing process of forming complementary MISFET. During such investigation, the inventor found the following problems.

That is, in the nonvolatile memory that the inventor has investigated, as shown in FIG. 54, a metal silicide layer 102 is formed on a surface of a floating gate electrode 101 of a data storage transistor (here, assumed as n-channel type), and a silicon nitride film 103 is formed in a manner of covering a surface of a semiconductor substrate while being contacted to a surface of the metal silicide layer. When the silicon nitride film 103 is formed by a thermal CVD process, an impurity introduced into the semiconductor substrate is diffused due to heat during such film formation, and device properties may be changed, therefore a plasma enhanced CVD process is used.

Moreover, even in the case of using the plasma enhanced CVD process, when $NH_3$ (ammonia) gas is used as deposition gas, it may apprehensively affect on the device properties. Therefore, an approach of plasma decomposition of a mixture of $SiH_4$ (silane) and $N_2$ (nitrogen) is used. However, in the case of the approach of the plasma decomposition of the mixture of $SiH_4$ (silane) and $N_2$ (nitrogen), a silicon-rich film is easily formed in an initial stage of film formation. Therefore, the silicon nitride film 103 tends to be formed into a silicon-rich thin film at interfaces with respect to the metal silicide layer 102, a sidewall spacer 104, and the semiconductor substrate. Consequently, leakage of electric charges tends to occur at the interfaces. Therefore, there is the following problem: electric charges stored in the floating gate electrode 101 are penetrated to an n-type semiconductor region 105 (source or drain) from the metal silicide layer 102 through a lower interface of the silicon nitride film 103, and thus discharged from a plug 106 electrically connected to the n-type semiconductor region 105, consequently a data holding property of the nonvolatile memory is reduced.

An object of the invention is to provide a nonvolatile memory having an excellent data holding property, and a technique of manufacturing the memory.

The above and other objects and novel features of the invention will be made clear from the description of the specification and accompanied drawings.

In inventions disclosed in the application, summaries of typical inventions are briefly described as follows.

A semiconductor device according to the invention includes;

a nonvolatile memory cell having a first gate electrode formed on a semiconductor substrate, wherein a first insulating film is formed on a sidewall of the first gate electrode, a second insulating film is formed on the first gate electrode, the nonvolatile memory cell has a third insulating film deposited on the semiconductor substrate in the presence of the first insulating film and the second insulating film, and the third insulating film has an etching selectivity ratio different from that of each of the first insulating film and the second insulating film.

Moreover, in the semiconductor device;

the first insulating film and the second insulating film include silicon oxide as a major component, and the third insulating film includes silicon nitride as a major component.

A method of manufacturing a semiconductor device according to the invention is a method of manufacturing a semiconductor device including a nonvolatile memory cell having a first gate electrode, the method including;

(a) a step of forming a first conductive film on a first gate electrode, (b) a step of forming a second insulating film on the first conductive film, (c) a step of patterning the second insulating film and the first conductive film to form the first-gate electrode from the first conductive film, and leave the second insulating film on the first gate electrode, (d) a step of forming a first insulating film on sidewalls of the first gate electrode and the second insulating film, after the step (c), and (e) a step of forming a third insulating film on the semiconductor substrate in the presence of the first insulating film and the second insulating film, the third insulating film having an etching selectivity ratio different from that of each of the first insulating film and the second insulating film.

Moreover, in the method of manufacturing the semiconductor device;

the first insulating film and the second insulating film include silicon oxide as a major component, and the third insulating film includes silicon nitride as a major component.

ADVANTAGE OF THE INVENTION

In the inventions disclosed in the application, advantages obtained by the typical inventions are briefly described as follows.

Reliability of a semiconductor device can be improved.

Moreover, reduction in data holding property of a nonvolatile memory can be prevented.

BEST MODE FOR CARRYING OUT THE INVENTION

Hereinafter, preferred embodiments of the invention will be described in detail according to drawings. In all figures for describing the embodiments, the same members are marked with the same references, and repeated description of them is omitted.

Embodiment 1

Figure 1:
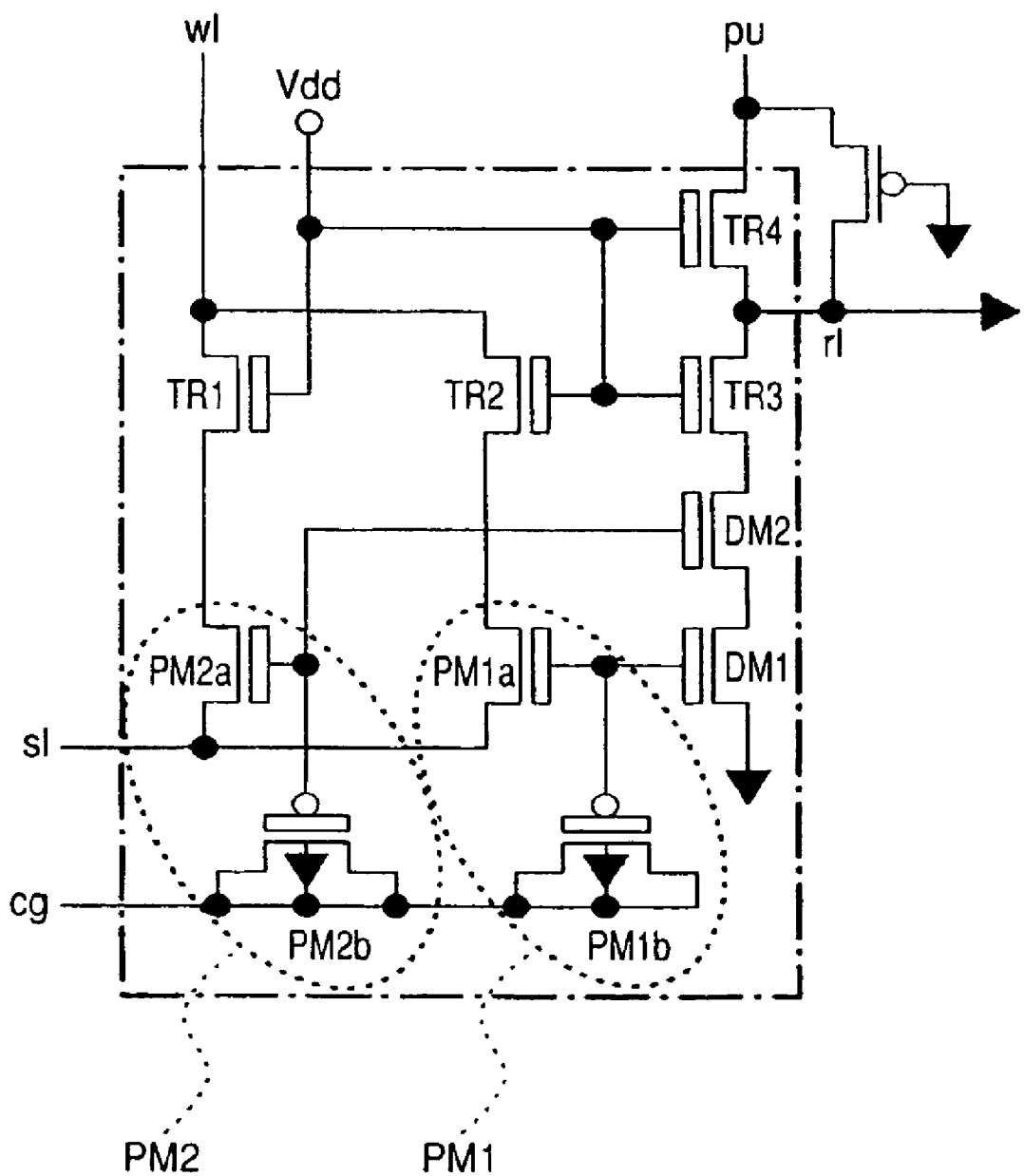
FIG. 1 is an equivalent circuit diagram of a memory cell in a nonvolatile memory of a semiconductor device of embodiment 1 of the invention.

FIG. 1 is an equivalent circuit diagram of a memory cell in a nonvolatile memory of a semiconductor device of the embodiment 1, and an area enclosed by a dashed line corresponds to a memory cell. In the circuit, floating gates of a plurality of nonvolatile memory elements PM1, PM2 are used as gate electrodes of a plurality of readout MISFETs DM1, DM2 in OR logic connection, and a control gate cg of the nonvolatile memory elements PM1 and PM2 is set to be 1.5 V during readout. The floating gates of the two nonvolatile memory elements PM1, PM2 are connected in series to the gate electrodes of the readout MISFETs DM1 and DM2 respectively.

The nonvolatile memory elements PM1 and PM2 have MIS capacitance elements PM1*b* and PM2*b* in which capacitance electrodes are provided on semiconductor regions working as control gate electrodes (described later in detail) via insulating layers, MISFETs PM1*a* and PM2*a* having sources and drains formed on other semiconductor regions, and gate electrodes, respectively. In circuit operation of the memory cell, while data are held by storage operation of electric charges by the floating gates of the nonvolatile memory elements PM1 and PM2, actually, since the floating gates of the nonvolatile memory elements PM1 and PM2 are used also as the gate electrodes of the MISFETs DM1 and DM2, electric charges are not only stored in the floating gates of the nonvolatile memory elements PM1 and PM2, but also stored in the gate electrodes of the readout MISFETs DM1 and DM2. The MIS capacitance elements PM1*b* and PM2*b* are configured by capacitance of MISFET structures in which sources, drains, and back gates are commonly connected respectively. The capacitance electrodes of the MIS capacitance elements PM1*b* and PM2*b* are commonly connected to the gate electrodes of the MISFETs PM1*a*, PM2*a* and thus work as the floating gate electrodes, respectively.

A drain of the readout MISFET DM2 is coupled to a control node pu via n-channel MISFETs TR3 and TR4, and therefore electric potential of a coupling node rl between the n-channel MISFET TR3 and the n-channel MISFET TR4 is provided to a write/read control circuit (omitted to be shown) as output. The MISFETs PM1*a* and PM2*a* are coupled to a control node wl via n-channel MISFETs TR1 and TR2. Gate electrodes of the n-channel MISFETs TR1 to TR4 are biased by power voltage Vdd.

Next, operation of the memory cell shown in FIG. 1 is described.

During data writing, for example, the source line sl and the control gate cg are set to be 9 V, and the control node wl is set to be 0 V so that the nonvolatile memory elements PM1 and PM2 are turned on, and thus hot electron injection is performed from a source line sl side to the floating gates.

In erasing operation, for example, only the source line sl is applied with 9V, so that electrons are emitted from the floating gates by tunnel emission.

In readout operation, for example, the control node pu is applied with 1.5 V, and the control gate cg is also applied with 1.5 V, so that electrical potential of the coupling node rl, which is determined by a switch state or a mutual conductance state of the readout MISFETs DM1, DM2 corresponding to storage charge on the floating gates, is latched by a latch circuit (omitted to be shown) in a subsequent stage. In the readout operation, both sides of the source (source line sl) and the drain (control node wl) of the nonvolatile memory elements PM1 and PM2 are fixed to 0 V. Therefore, weak hot electrons may not be injected from the MISFETs PM1*a* and PM2*a* into the floating gates during readout. At that time, while weak hot electron injection may by naturally induced from the readout MISFETs DM1 and DM2 into the floating gates, since the n-channel MISFETs TR4 and TR3, and the readout MISFETs DM2 and DM1 are vertically stacked, drain voltage of the readout MISFETs DM1 and DM2 is decreased to voltage of the control node pu or lower. Moreover, since a control level of the control gate cg is also low during readout, such hot electron injection can be estimated to be small as to be substantially neglected. Consequently, the readout error rate of the nonvolatile memory elements PM1 and PM2 themselves can be reduced.

As an application of the nonvolatile memory as above, relief of a bad memory cell of DRAM (Dynamic Random Access Memory) by redundancy can be exemplified. In this case, the memory cell as shown in FIG. 1 is a unit data cell, and a plurality of the unit data cells are collected, so that an electric program circuit for the nonvolatile memory elements of a plurality of unit data cells is formed, and the plurality of unit data cells become a memory circuit of relief data for a circuit to be relieved. Thus, reliability of bad cell relief can be improved.

Moreover, a fuse program circuit may be further provided as a different relief data memory circuit for the circuit to be relieved, which is for storing relief data depending on a fusing condition of a fuse element. Relief for a bad cell detected in a wafer level is performed by a fuse program circuit, and the electric program circuit is used for a bad cell detected after burn-in, thereby relief efficiency can be improved.

Figure 2:
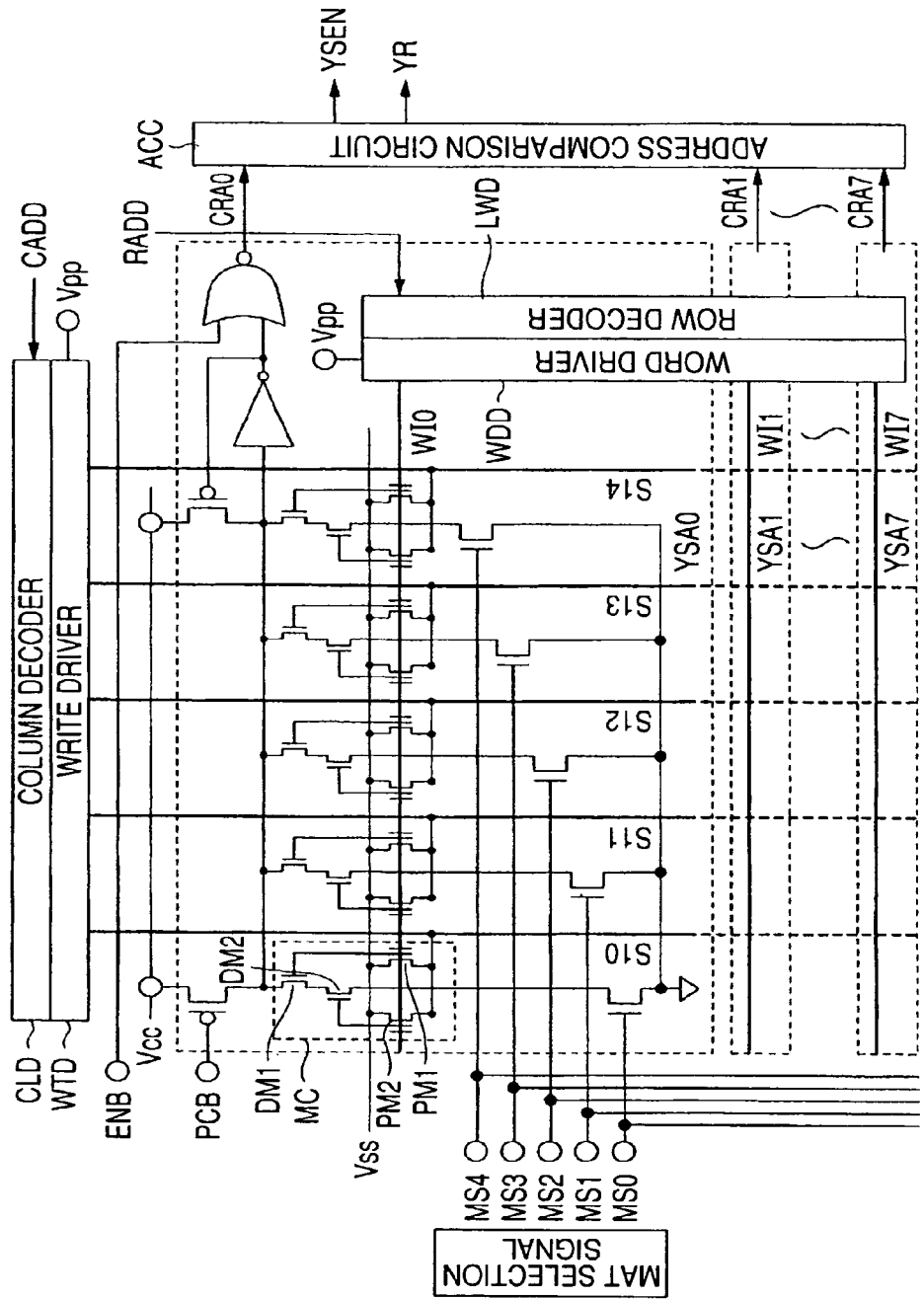
FIG. 2 is a mat selection relief circuit diagram of DRAM to which the nonvolatile memory of the semiconductor device of the embodiment 1 of the invention is applied.

Here, FIG. 2 shows a mat selection relief circuit diagram of DRAM for explaining relief of a bad memory cell of the DRAM by the redundancy. In the circuit shown in FIG. 2, a column decoder CLD for write control, write driver WTD, row decoder LWD, and word driver WDD are added to replace a previous laser meltdown fuse with the nonvolatile memory element in the embodiment 1. Writing is performed to the nonvolatile memory element, thereby a state equivalent to a state where a fuse is melted can be realized, and readout operation may be the same operation as in the case of the previous laser meltdown fuse. Power voltage Vpp necessary for writing is externally supplied. Memory cells MC having a basic configuration as described in FIG. 1 are provided in a matrix of 8 rows and 5 columns, which are selected one by one by the column decoder CLD and the row decoder LWD so that writing is enabled. Writing data lines s10 to s14 (corresponding to the source line s1 (refer to FIG. 1)) are connected to the writing driver WTD, and writing word lines w10 to w17 (corresponding to the control node w1 (refer to FIG. 1)) are connected to the word driver WDD. The column decoder CLD decodes a column address signal CADD to generate a selection signal of the writing data lines s10 to s14 during writing operation, so that a selected writing data line is driven by the writing driver WTD. Selection of the writing word lines w10 to w17 during writing operation is directed to the word driver WDD by the row decoder LWD for decoding a low address signal RADD. Readout is performed in 8 memory cells MC selected in column by mat selection signals MS0 to MS4. Readout data are supplied to an address comparison circuit ACC as relief address data CRA0 to CRA7, and compared with corresponding 8 bits of an access address signal at that time, and comparison results YSEN and YR are used for selection control of redundancy.

Next, a structure of the nonvolatile memory of the embodiment 1 is described together with a manufacturing process of the memory using FIGS. 3 to 20. Respective plane views in FIGS. 3 to 20 show a single memory cell. In each of cross section views, a portion marked with a reference A indicates a cross section of a memory cell along a line A-A of a corresponding plane view, a portion marked with a reference B indicates a cross section of a memory cell along a line B-B of a corresponding plane view, a portion marked with a reference C indicates a cross section of a memory cell along a line C-C of a corresponding plane view, and other portions indicate cross sections of a part of a peripheral circuit region (first region), respectively. In each of the plane views, only major conductive layers configuring the memory cell and connection regions of them are shown, and insulating films and the like formed between the conductive layers are omitted to be shown as a rule. While an X decoder circuit, a Y decoder circuit, a sense amplifier circuit, an input/output circuit, and a logic circuit are formed by an n-channel MISFET and p-channel MISFET configuring peripheral circuits, they are not restrictive, and a logic circuit such as microprocessor or CPU may be formed.

Figure 3:
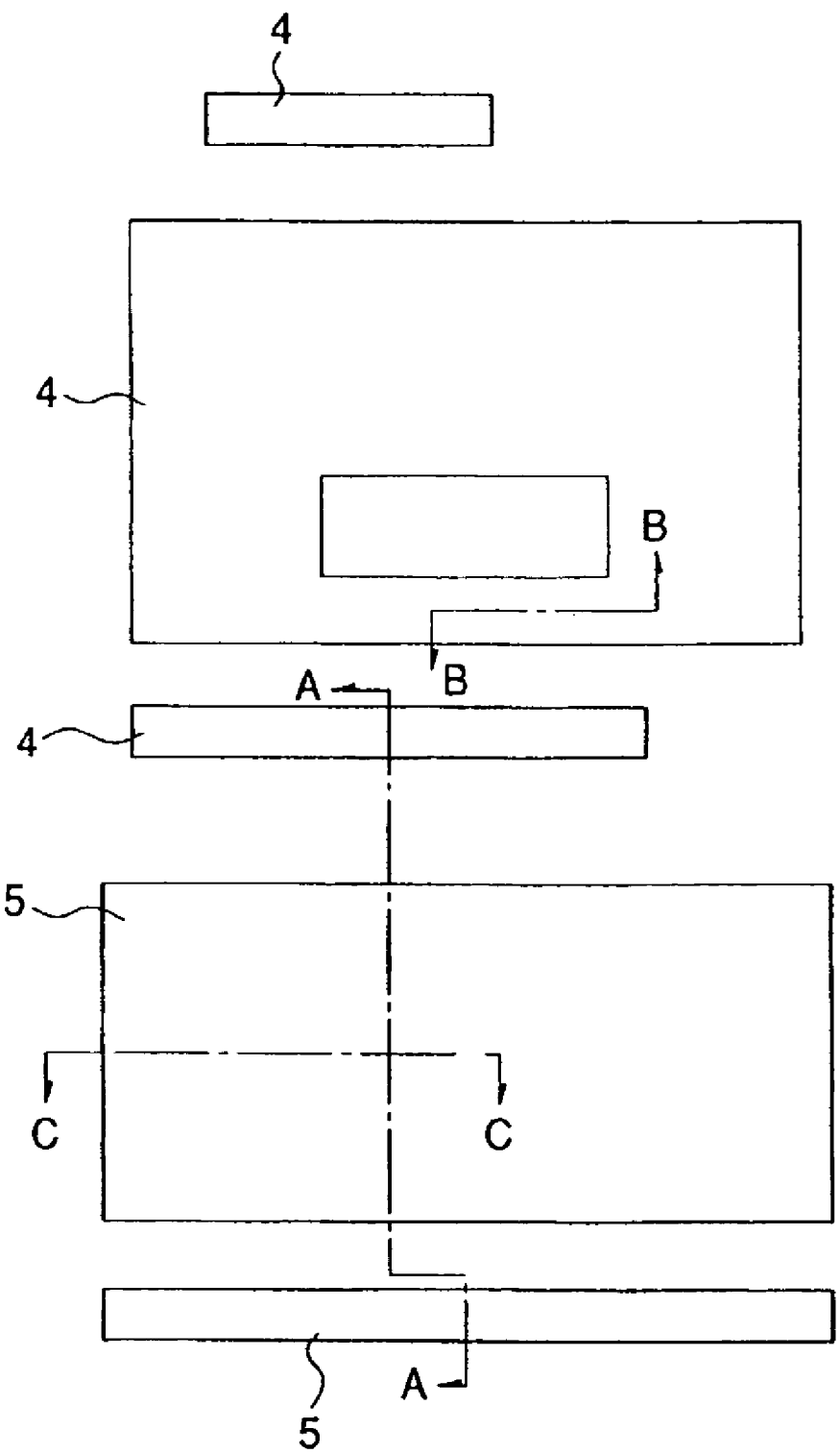
FIG. 3 is a plane view of a relevant part for explaining a method of manufacturing the semiconductor device of the embodiment 1 of the invention.
Figure 4:
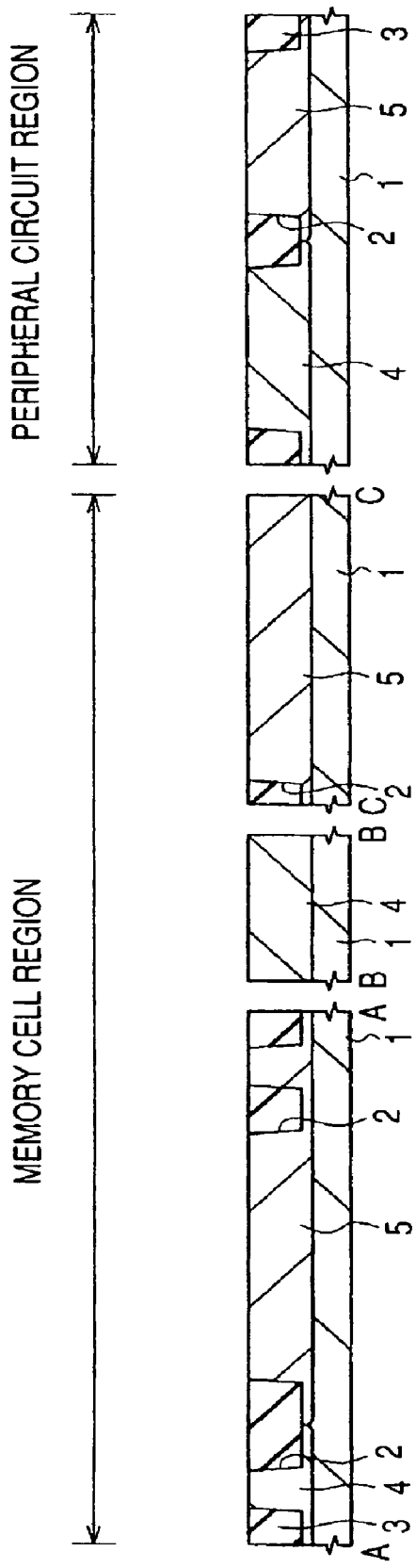
FIG. 4 is a cross section view of a relevant part for explaining a method of manufacturing the semiconductor device of the embodiment 1 of the invention.

First, as shown in FIG. 3 and FIG. 4, element isolation grooves 2 are formed in element isolation regions on a main surface of a semiconductor substrate (hereinafter, simply mentioned as substrate) 1 including, for example, p-type single crystal silicon. To form the element isolation grooves 2, grooves are formed, for example, by performing dry etching the main surface of the substrate 1, then an insulating film such as a silicon oxide film 3 is deposited on the substrate 1 including the insides of the grooves by a CVD (Chemical Vapor Deposition) process, and then an unnecessary silicon oxide film 3 outside the grooves is polished and removed by a chemical mechanical polishing (CMP) process, thereby silicon oxide films 3 are left within the grooves. The element isolation grooves 2 are formed, thereby active regions whose peripheries are defined by the element isolation grooves 2, are formed on the main surface of the substrate 1 of a memory array.

Next, for example, a part of the substrate 1 is subjected to ion implantation of an n-type impurity (for example, P (phosphorous)), and a different part of the substrate is subjected to ion implantation of a p-type impurity (for example, B (boron)), then the substrate 1 is subjected to heat treatment to diffuse the impurities into the substrate 1, thereby a p-type well 4 and an n-type well 5 are formed on the main surface of the substrate 1.

Figure 5:
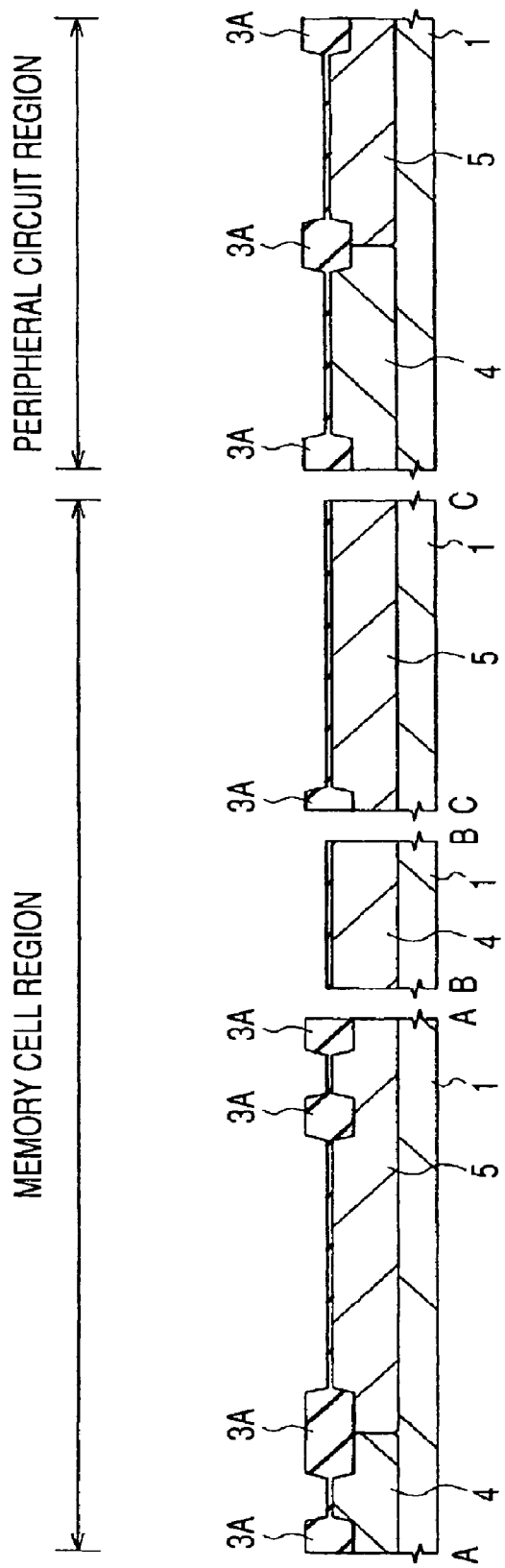
FIG. 5 is a cross section view of a relevant part for explaining a method of manufacturing the semiconductor device of the embodiment 1 of the invention.

While an example of defining the active regions by the element isolation grooves 2 was described in the embodiment 1, the active regions may be defined by forming field insulating films 3A as shown in FIG. 5 instead of the element isolation grooves 2. Such field insulating films 3A can be formed by the so-called LOCOS (Local Oxidation of Silicon) process in which a pattern of a silicon nitride film as an oxidation resistance film is formed on surfaces of the substrate 1, which are to be active regions, and then the surfaces of the substrate 1 are thermally oxidized. In the embodiment 1 hereinafter, cross section views in the case of defining the active regions by the element isolation grooves 2 are used for description.

Figure 6:
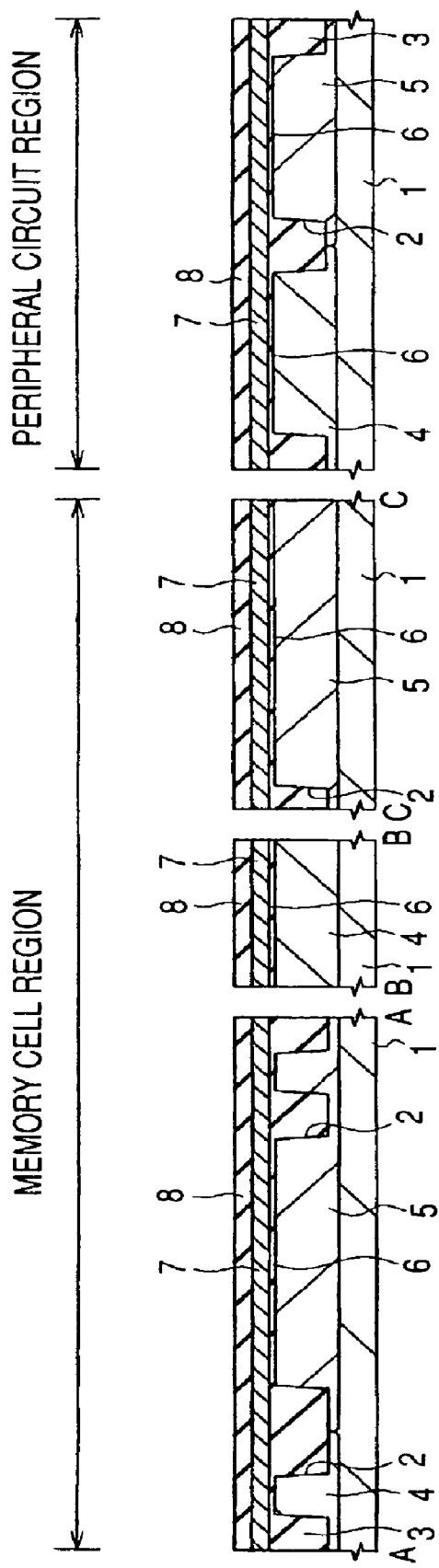
FIG. 6 is a cross section view of a relevant part during a manufacturing process of the semiconductor device following FIG. 4.

Next, as shown in FIG. 6, the substrate 1 is thermally oxidized to form gate insulating films 6 including, for example, silicon oxide on respective surfaces of the p-type wells 4 and the n-type wells 5. Then, a polycrystalline silicon film 7 is formed as a first conductive film on the gate insulating films 6 by, for example, a CVD process, and then an insulating film (second insulating film) 8 including a silicon oxide film or the like is deposited on an upper part of the polycrystalline silicon film 7 by, for example, the CVD process. Before the insulating film 8 is formed, polycrystalline silicon films 7 formed on the p-type wells 4 have been implanted with an impurity showing an n-type conduction type, and polycrystalline silicon films 7 formed on the n-type wells 5 have been implanted with an impurity showing an p-type conduction type, respectively.

Figure 7:
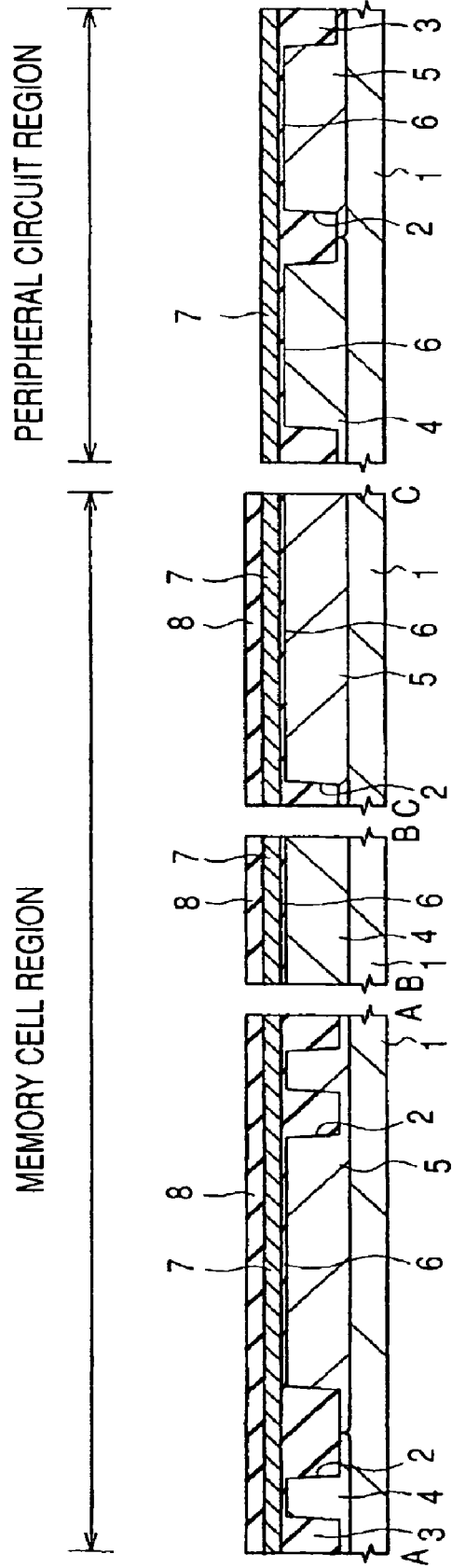
FIG. 7 is a cross section view of a relevant part during the manufacturing process of the semiconductor device following FIG. 6.
Figure 8:
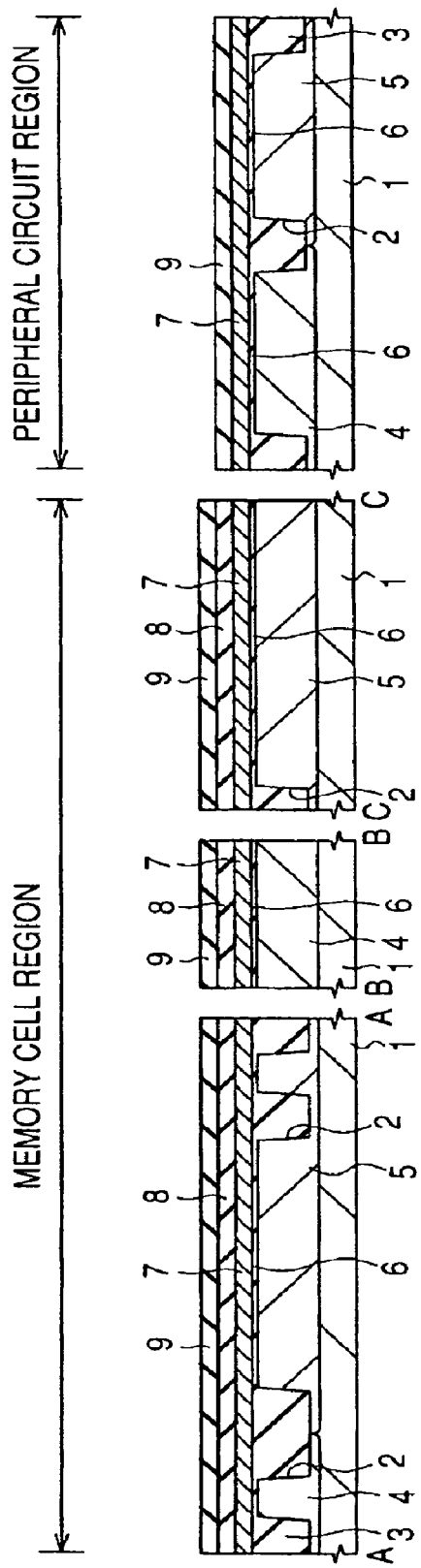
FIG. 8 is a cross section view of a relevant part during the manufacturing process of the semiconductor device following FIG. 7.

Next, as shown in FIG. 7, the insulating film 8 in the peripheral circuit region is removed by dry etching using a photoresist film (omitted to be shown), which has been patterned by a photolithography technique, as a mask. Then, as shown in FIG. 8, an insulating film (fifth insulating film) is deposited on the substrate 1 by, for example, CVD process, the film including a silicon oxide film having a thickness of about 10 nm or more.

Figure 9:
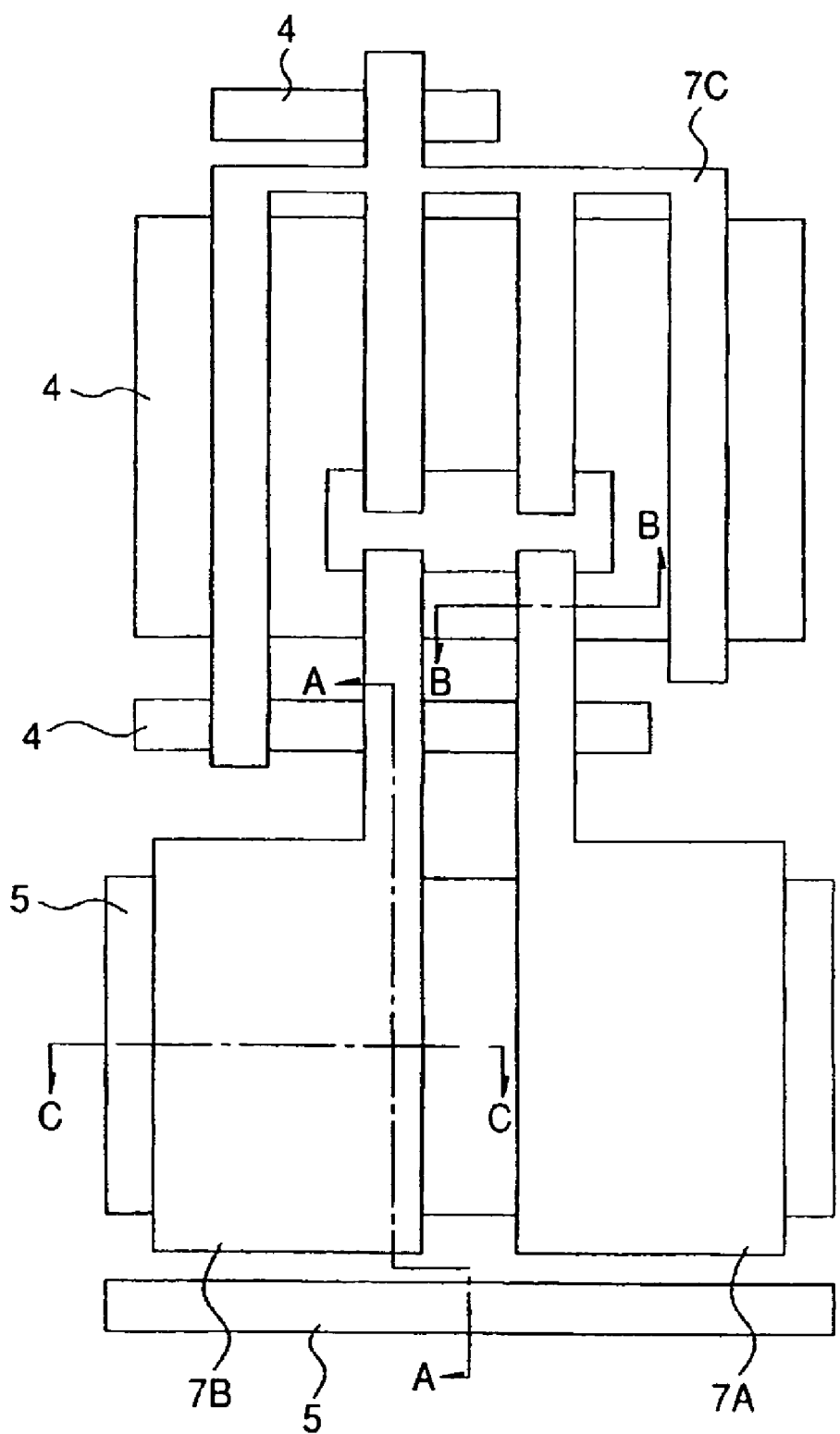
FIG. 9 is a plane view of a relevant part during the manufacturing process of the semiconductor device of the embodiment 1 of the invention.
Figure 10:
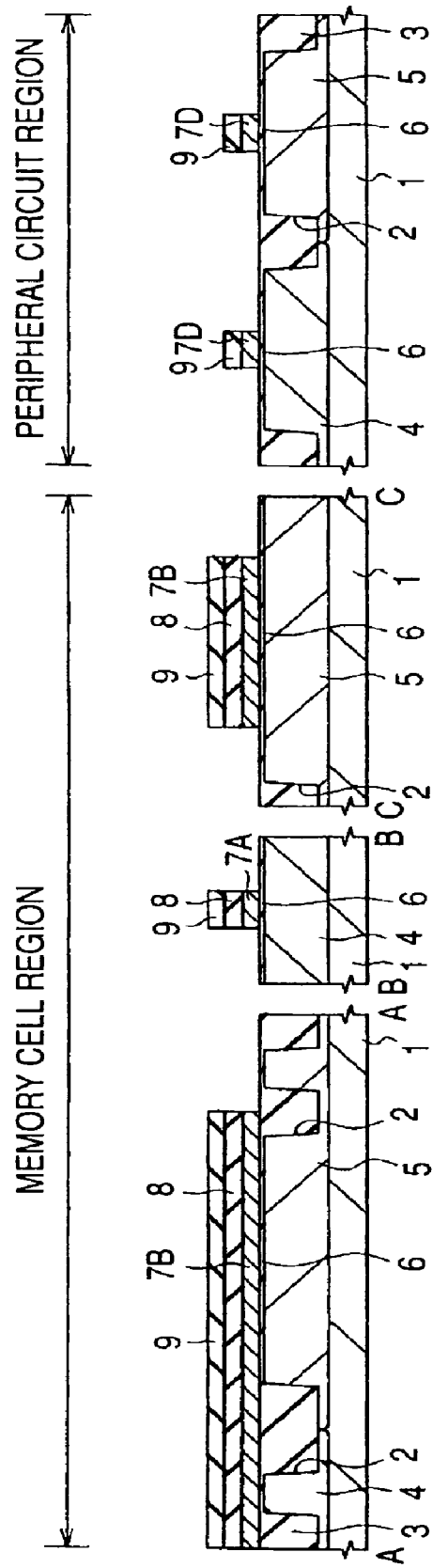
FIG. 10 is a cross section view of a relevant part during the manufacturing process of the semiconductor device following FIG. 8.

Next, as shown in FIG. 9 and FIG. 10, the insulating films 9 and 8 are patterned by dry etching using a photoresist film (omitted to be shown) patterned by the photolithography technique as a mask. At that time, while thickness of the insulating films 9 and 8 on the polycrystalline silicon film is different between the memory cell region (A-A, B-B and C-C) and the peripheral circuit region, since the polycrystalline silicon film 7 acts as an etching stopper, a cap film including the insulating films 9 and 8 can be formed in the memory cell region (A-A, B-B and C-C), and a cap film including the insulating film 9 can be formed in the peripheral circuit region. Then, the polycrystalline silicon film 7 is subjected to dry etching to be patterned using the cap films as a mask, so that gate electrodes 7A, 7B, 7C and 7D are formed. The gate electrode (first gate electrode) 7A acts as the floating gate electrode of the MISFET PM1a (refer to FIG. 1), gate electrode of the readout MISFET DM1 (refer to FIG. 1), and a capacitance electrode of the MIS capacitance element MP1b (refer to FIG. 1). The gate electrode 7B (first gate electrode) acts as the floating gate electrode of the MISFET PM2a (refer to FIG. 1), gate electrode of the readout MISFET DM2 (refer to FIG. 1), and a capacitance electrode of the MIS capacitance element MP2b (refer to FIG. 1). The gate electrode 7C acts as gate electrodes of the n-channel MISFETs TR1 to TR4. The gate electrode 7D (second gate electrode) acts as a gate electrode of MISFET formed in the peripheral circuit region.

Figure 11:
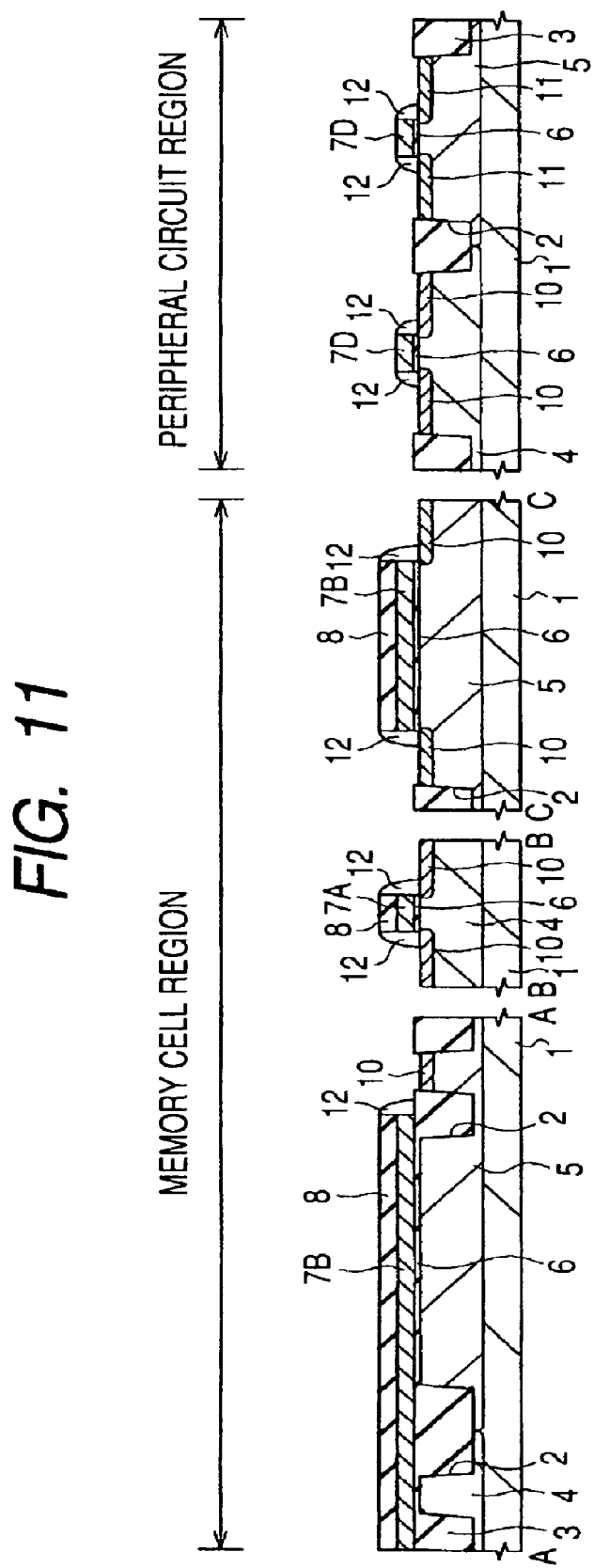
FIG. 11 is a cross section view of a relevant part during the manufacturing process of the semiconductor device following FIG. 10.

Next, as shown in FIG. 11, for example, the p-type well 4 and the n-type well 5 are partially subjected to ion implantation of phosphorous or arsenic as an n-type impurity, thereby an n-type semiconductor region 10 in a comparatively low concentration is formed, and the n-type well 5 is subjected to ion implantation of boron as a p-type impurity, thereby a p$^-$-type semiconductor region 11 in a comparatively low concentration is formed. The n$^-$-type semiconductor region 10 is formed for making respective sources and drains of the MISFETs PM1a and PM2a, readout MISFETs DM1 and DM2, n-channel MISFETs TR1 to TR4, and n-channel MISFETs formed in the peripheral circuit region, into a LDD (lightly doped drain) structure. Furthermore, the n$^-$-type semiconductor region 10 is formed for configuring part of the control gate cg of the MIS capacitance elements PM1b and PM2b. The p$^-$-type semiconductor region 11 is formed for making sources and drains of p-channel MISFETs formed in the periphery circuit region, into the LDD structure.

Next, a silicon oxide film is deposited on the substrate 1 by the CVD process, then the silicon oxide film and the insulating film 9 are anisotropically etched, thereby sidewall spacers (first insulating film) 12 are formed on sidewalls of the gate electrodes 7A, 7B, 7C and 7D and the insulating films B. At that time, when silicon oxide film is formed into the sidewall spacer 12, the insulating film 9 as the cap film is removed and surfaces of the gate electrodes 7D are exposed in the peripheral circuit region, however, in the memory cell region (A-A, B-B and C-C), the insulating films 9 and 8 as the cap film are etched in a degree that the insulating film 9 is merely removed by etching, and formed into a structure where the insulating films 8 are left on the gate electrodes A and B. At that time, even if the insulating film 9 is somewhat left on the insulating film 8, it may not cause any problem in MISFET properties.

That is, the insulating film 8 (or insulating films 9 and 8) as the cap film is left on the gate electrodes A and B in the memory cell region, and the insulating film 9 as the cap film on the gate electrode 7C of the n-channel MISFETs TR1 to TR4 and the gate electrode 7D in the peripheral circuit region is removed.

Figure 12:
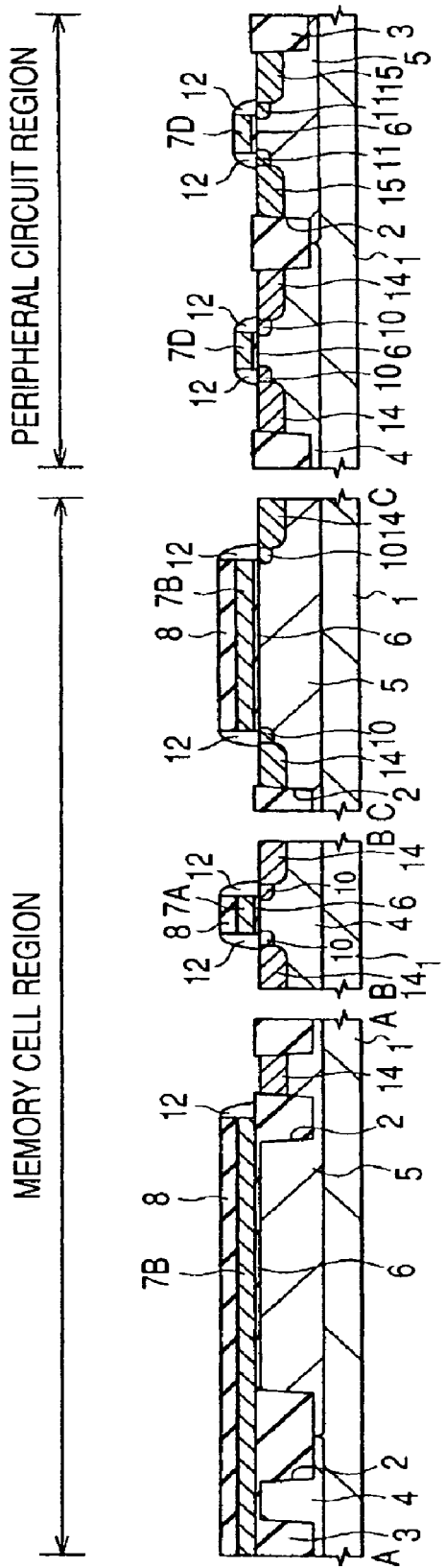
FIG. 12 is a cross section view of a relevant part during the manufacturing process of the semiconductor device following FIG. 11.

Next, as shown in FIG. 12, the p-type well 4 and the n-type well 5 are partially subjected to ion implantation of phosphorous or arsenic as an n-type impurity, thereby an n$^+$-type semiconductor region 14 in a comparatively high concentration is formed, and the n-type well 5 is subjected to ion implantation of boron as a p-type impurity, thereby a p$^+$-type semiconductor region 15 in a comparatively high concentration is formed. The n$^+$-type semiconductor region 14 configures respective sources and drains of the MISFETs PM1a and PM2a, readout MISFETs DM1 and DM2, n-channel MISFETs TR1 to TR4, and n-channel MISFETs formed in the peripheral circuit region. Furthermore, the n$^+$-type semiconductor region 14 is formed for configuring the control gate cg of the MIS capacitance elements PM1b and PM2b. The p$^+$-type semiconductor region 15 configures a source and a drain of the p-channel MISFET formed in the peripheral circuit region. An n$^+$-type semiconductor region 14 formed in the n-type well 5 of the memory cell acts as the control gate cg (refer to FIG. 1).

Figure 13:
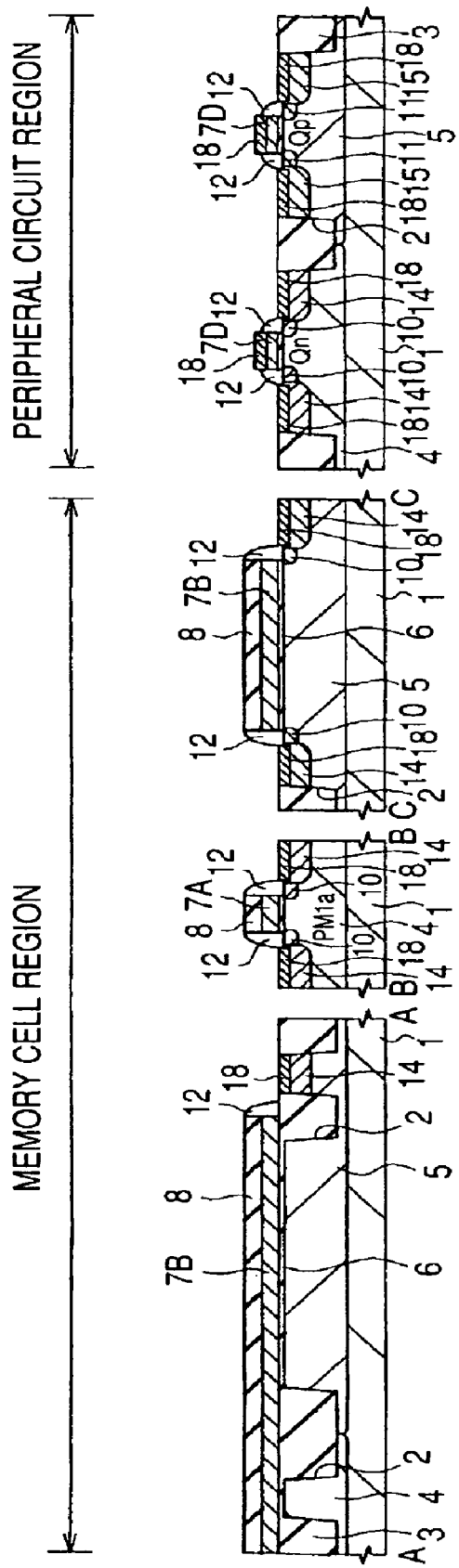
FIG. 13 is a cross section view of a relevant part during the manufacturing process of the semiconductor device following FIG. 12.

Next, as shown in FIG. 13, a silicide layer 18 is formed. In formation of the silicide layer 18, first, for example, a Co (cobalt) film is deposited on the substrate 1 by a sputtering process. Then, the substrate 1 is subjected to heat treating to induce a silicide reaction at an interface between the Co film and the gate electrode 7D in the peripheral circuit region, and an interface between the Co film and the substrate 1, then an unreacted Co film is removed by etching. Thus, a silicide (CoSi$_2$) layer 18 is formed on the surface of the gate electrode 7D and surfaces of the sources and drains (n$^+$-type semiconductor regions 14 and p$^+$-type semiconductor regions 15). While not shown, the silicide layers 18 are formed also on the surfaces of the gate electrode 7C. Moreover, in the memory cell region, the silicide layer 18 is formed also on the surface of the n$^+$-type semiconductor regions 14. Here, since the insulating film 8 as the cap film is left on the gate electrodes 7A, 7B, the silicide layer 18 is not formed. While Co (cobalt) was exemplified as a material of the silicide layer 18 in the embodiment 1, the material is not limited to this, and Ti (titanium), W (tungsten), Ni (nickel) or the like can be also used.

As a result of steps as above, the MISFETs PM1a, PM2a (refer to FIG. 1) and the MIS capacitance elements PM1b, PM2b (refer to FIG. 1), which form nonvolatile memory elements PM1, PM2 (refer to FIG. 1), readout MISFETs DM1, DM2 (refer to FIG. 1), and n-channel MISFETs TR1 to TR4 (refer to FIG. 1) are formed in the memory cell, and a p-channel MISFET Qp and an n-channel MISFET Qn are formed in the peripheral circuit region. In the memory cell, the MIS capacitance element PM1a is a capacitance element using the substrate 1 (n-type well 5) and the gate electrode 7A on the n-type well 5 as capacitance electrodes, and using the gate insulating film 6 as a capacitance insulating film. The MIS capacitance element PM2b is a capacitance element using the substrate 1 (n-type well 5) and the gate electrode 7B on the n-type well 5 as capacitance electrodes, and using the gate insulating film 6 as a capacitance insulating film.

Figure 14:
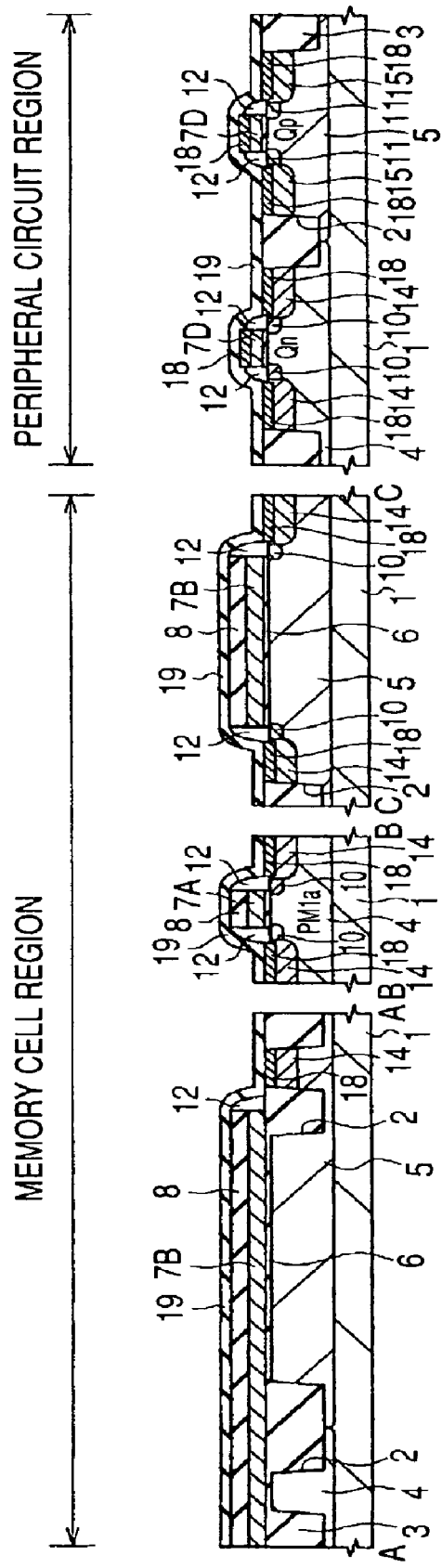
FIG. 14 is a cross section view of a relevant part during the manufacturing process of the semiconductor device following FIG. 13.

Next, as shown in FIG. 14, a silicon nitride film (third insulating film) 19 is deposited on the substrate 1 by the plasma enhanced CVD process in a way of covering the gate electrodes 7A, 7B, 7C and 7D, insulating films 9 and 8, and sidewall spacer 12. The silicon nitride film 19 works such that when an interlayer insulating film is formed on the substrate 1 in a subsequent step, and contact holes are formed in the interlayer insulating film, the holes being penetrated to each of the n+-type semiconductor region 14 and the p+-type semiconductor region 15, the contact holes are prevented from being penetrated to the gate electrodes 7A, 7B, 7C and 7D by increasing etching selectivity ratio to the sidewall spacers formed from the silicon oxide film. Moreover, the silicon nitride film 19 works to prevent a surface of the silicide layer from being reduced by overetching. That is, the silicon nitride film 19 works as an etching stopper film.

When the silicon nitride film 19 is formed by the thermal CVD process, the impurity introduced into the substrate 1 is diffused by heat during such film formation, consequently characteristics of a device included in the semiconductor device of the embodiment 1 may be changed. Therefore, the plasma enhanced CVD process is preferably used, by which a film can be formed at low temperature compared with the thermal CVD process as described before. Moreover, even in the case of using the plasma enhanced CVD, when $NH_3$ gas is used as deposition gas, it may apprehensively affect on the characteristics of the device. Therefore, an approach of plasma decomposition of a mixture of $SiH_4$ (silane) and $N_2$ (nitrogen) can be exemplified. When the plasma decomposition is shown in a chemical reaction formula, $SiH_4 + N_2 \rightarrow Si_xN_y + zH_2$ is given (x, y, or z is an integer).

In the case that the silicon nitride film 19 is formed by the approach, a silicon-rich film is easily formed in an initial stage of film formation. When such a silicon nitride film 19 is in a condition of being electrically connected to gate electrodes 7A and 7B of the MISFETs PM1a and PM2a forming the nonvolatile memory elements PM1 and PM2, since electric charges tend to leak in a portion of the silicon-rich film, electric charges stored in the gate electrodes 7A and 7B as the floating gate electrodes of the nonvolatile memory elements PM1 and PM2 may leak from interfaces between the silicon nitride film 19 and the gate electrodes 7A, 7B, and the electric charges may reach the n+-type semiconductor region 14, and thus discharged from a plug (formed in a subsequent step) electrically connected to the n+-type semiconductor region 14. That is, the data holding property of the nonvolatile memory may be apprehensively reduced.

On the other hand, in the embodiment 1, the sidewall spacer 12 or the insulating film 8, which is formed from a silicon oxide film that hardly allows leakage of electric charges compared with the silicon nitride film 19 (highly insulative compared with the silicon nitride film 19), is formed between the silicon nitride film 19 and the gate electrodes 7A, 7B. That is, the silicon nitride film 19 as an etching stopper film is formed on the gate electrodes 7A, 7B via the insulating film 8 or the sidewall spacer 12 which is a silicon oxide film highly insulative compared with the silicon nitride film 19. Therefore, since the electric charges stored in the gate electrodes 7A, 7B are hardly allowed to leak, reduction in the data holding property of the nonvolatile memory of the embodiment 1 can be prevented. That is, reliability of the semiconductor device can be improved.

Figure 15:
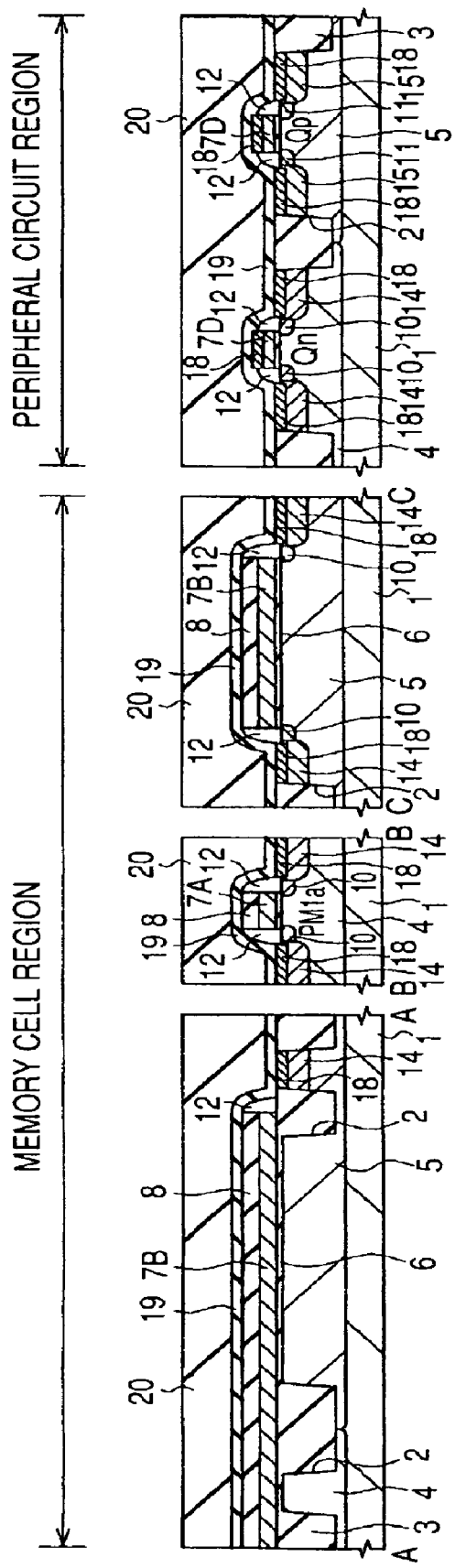
FIG. 15 is a cross section view of a relevant part during the manufacturing process of the semiconductor device following FIG. 14.

Next, as shown in FIG. 15, as an insulating film covering MISFETs PM1a and PM2a, MIS capacitance elements PM1b and PM2b, readout MISFETs DM1 and DM2, n-channel MISFETs TR1 to TR4, p-channel MISFET Qp, and n-channel MISFET Qn, a silicon oxide film 20 is deposited by, for example, the CVD process, and then a surface of the silicon oxide film 20 is planarized by a chemical mechanical polishing process.

Figure 16:
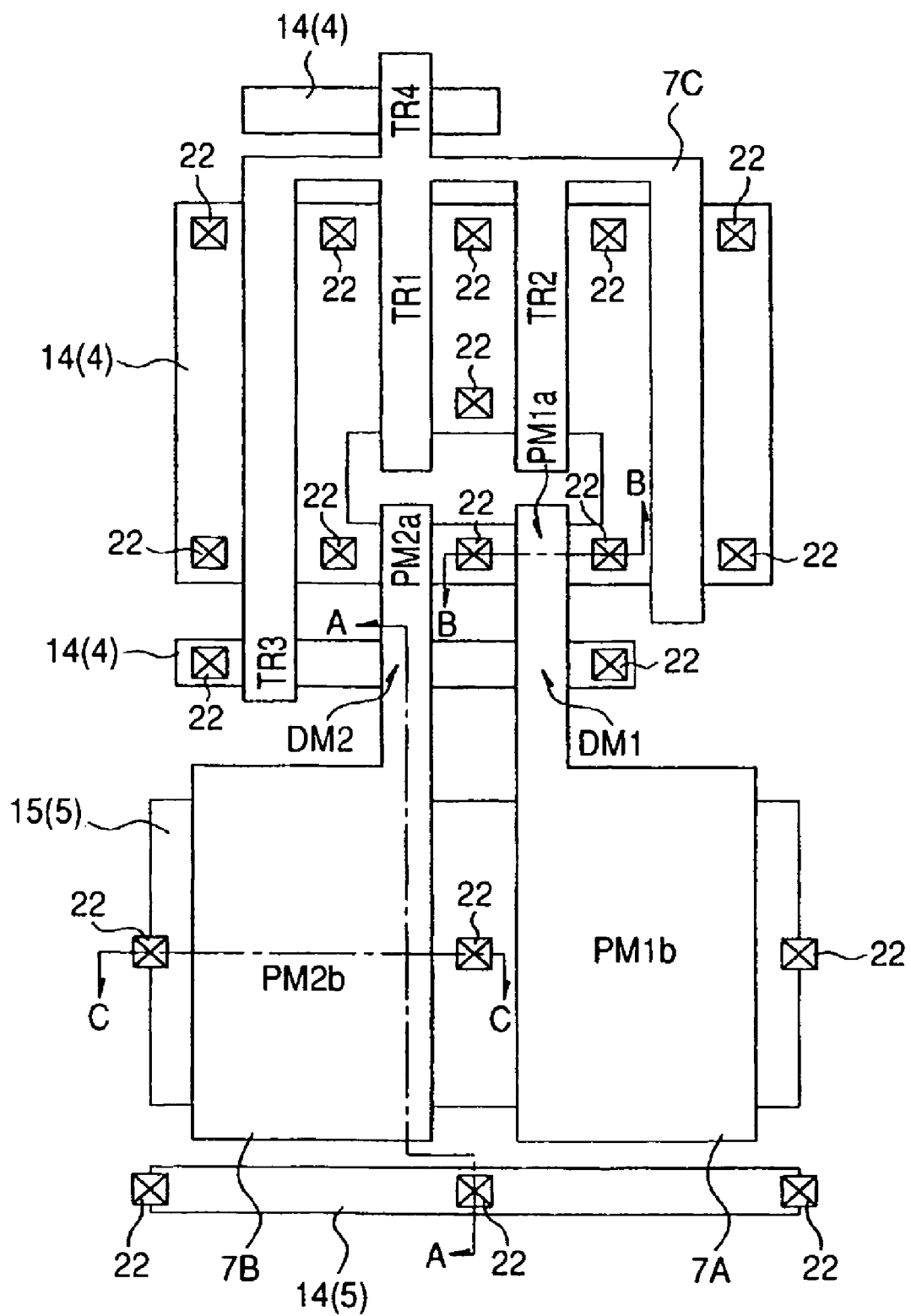
FIG. 16 is a plane view of a relevant part during the manufacturing process of the semiconductor device of the embodiment 1 of the invention.
Figure 17:
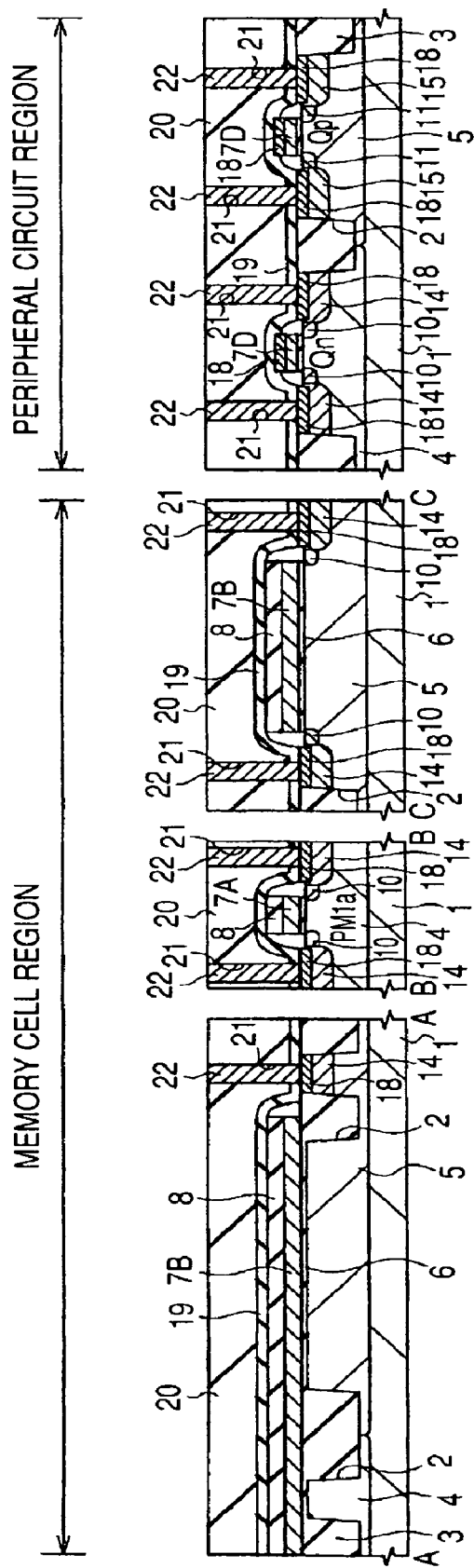
FIG. 17 is a cross section view of a relevant part during the manufacturing process of the semiconductor device following FIG. 15.

Next, as shown in FIG. 16 and FIG. 17, the silicon oxide film 20 is subjected to dry etching using a photoresist film as a mask, thereby contact holes 21 are formed, which are penetrated to each of the n+-type semiconductor region 14 and the p+-type semiconductor region 15. At that time, the silicon nitride film 19 acts as an etching stopper film in etching the silicon oxide film 20. Then, plugs 22 are formed within the contact holes 21. To form the plugs 22, for example, a Ti (titanium) film and a TiN (titanium nitride) film is deposited on the silicon oxide film 20 including the insides of the contact holes 21 by a sputtering process, then a TiN film and a W (tungsten) film as a metal film are deposited by the CVD process, and then the W film, TiN film and Ti film outside the contact holes 21 are removed by the chemical mechanical polishing process.

Figure 18:
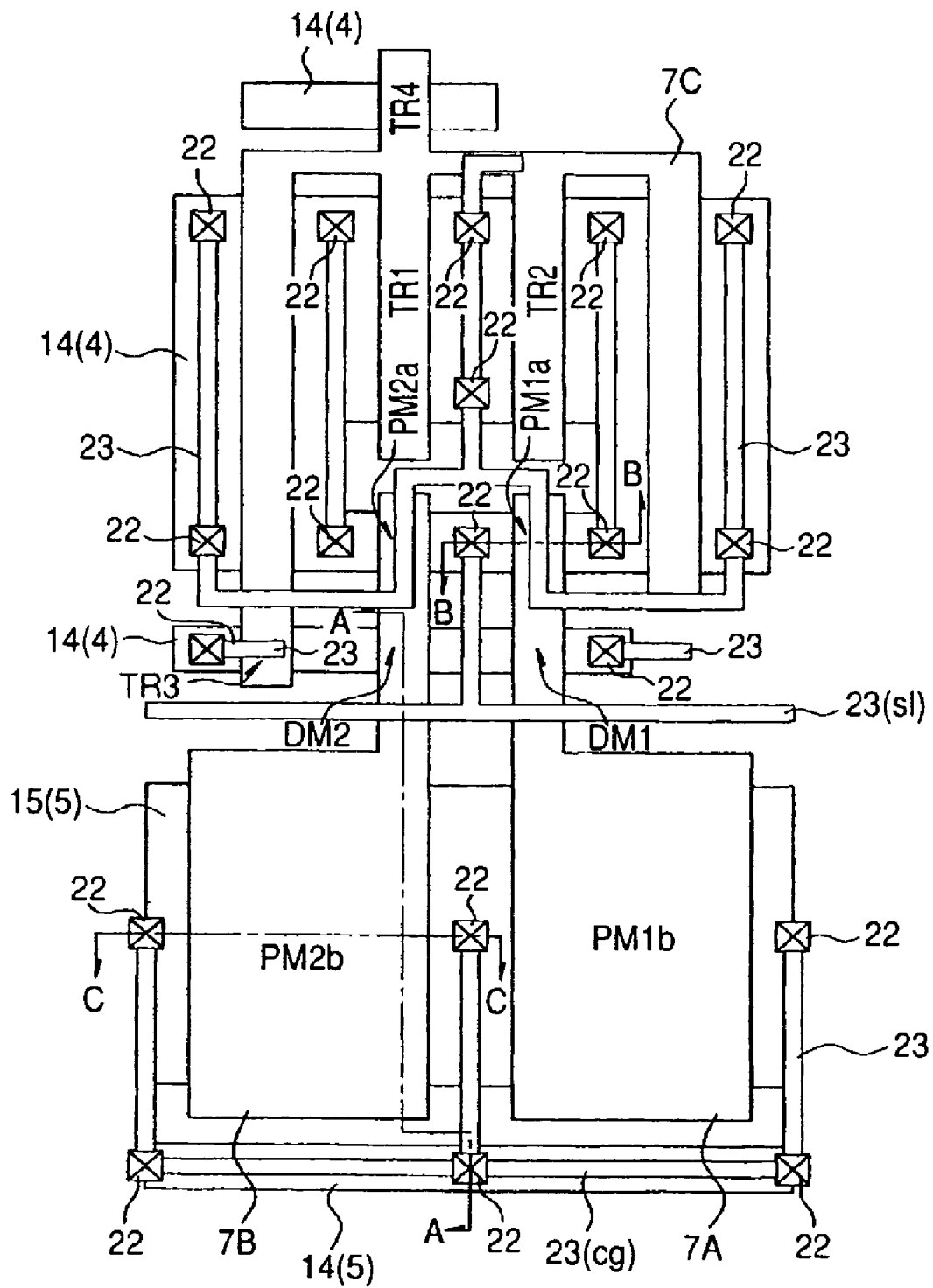
FIG. 18 is a plane view of a relevant part during the manufacturing process of the semiconductor device following FIG. 16.
Figure 19:
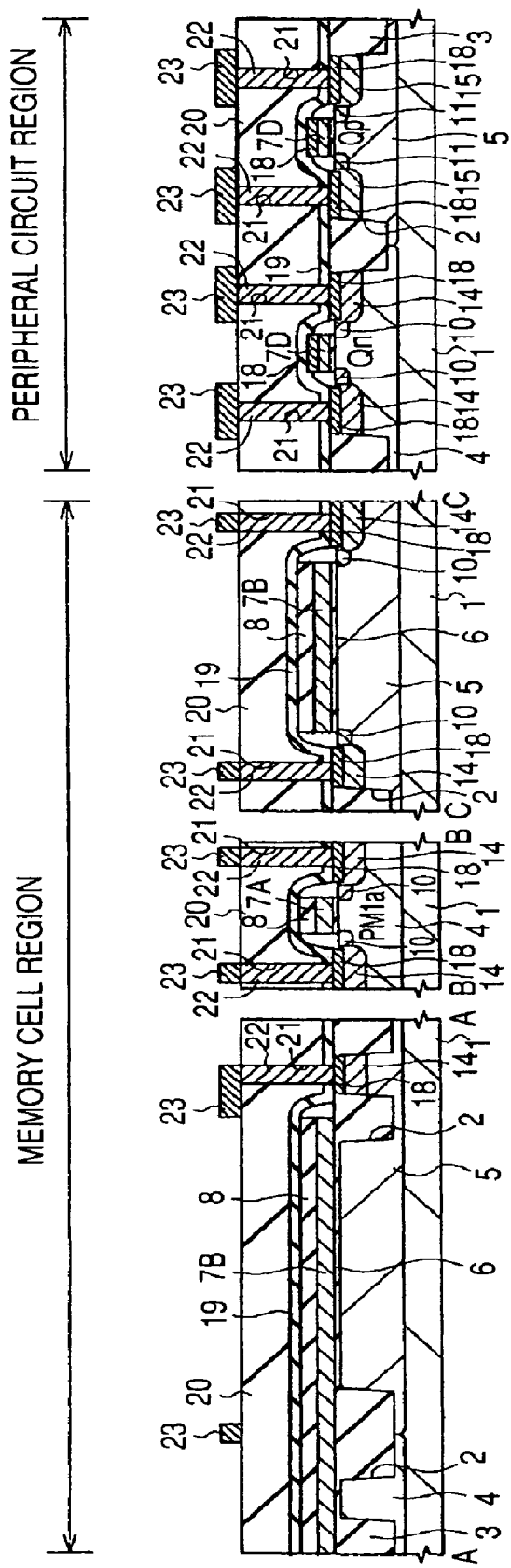
FIG. 19 is a cross section view of a relevant part during the manufacturing process of the semiconductor device following FIG. 17.

Next, as shown in FIG. 18 and FIG. 19, a plurality of wiring lines 23 are formed on the silicon oxide film 20 and the plugs 22. To form the wiring lines 23, for example, a Ti film, an Al (aluminum) alloy film and a TiN film are sequentially deposited on the silicon oxide film 20 by the sputtering process, and then the Ti film, Al (aluminum) alloy film and TiN film are patterned by dry etching using a photoresist film as a mask. The wiring lines 23 include a wiring line to be electrically connected to the control gate cg (refer to FIG. 1), and a wiring line to be the source line sl (refer to FIG. 1).

Figure 20:
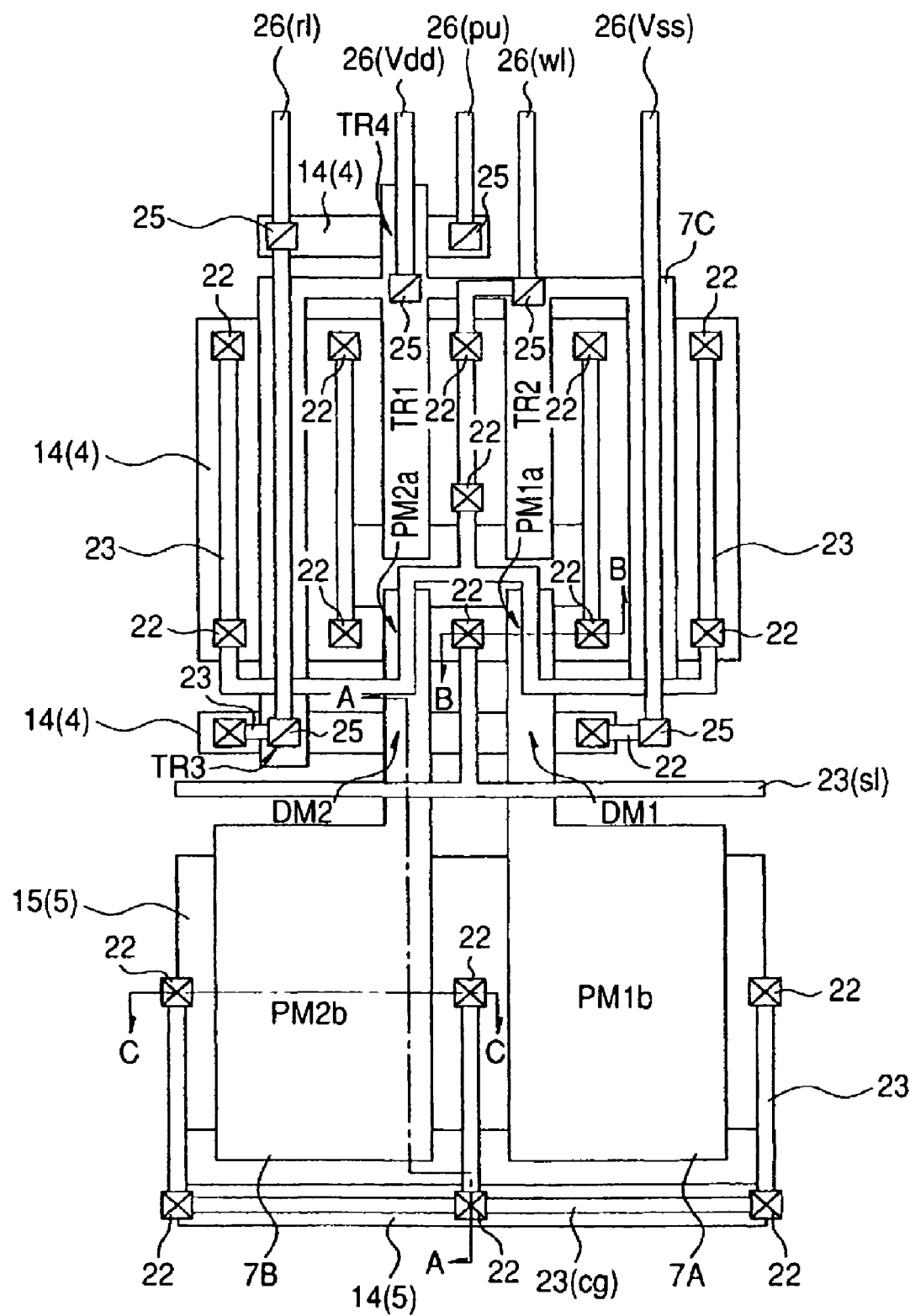
FIG. 20 is a cross section view of a relevant part during the manufacturing process of the semiconductor device following FIG. 18.

Next, as shown in FIG. 20, for example, a silicon oxide film (omitted to be shown) is deposited on the substrate 1 as an interlayer insulating film, then contact holes penetrated to the wiring lines 23 are formed in the silicon oxide film, and then plugs 25 similar to the plugs 22 are formed in the contact holes. Then, a plurality of wiring lines 26 are formed on the silicon oxide film and the plugs, so that the semiconductor device of the embodiment is manufactured. The wiring lines 26 can be formed in the same steps as in the wiring lines 23. The wiring lines 26 include a wiring line electrically connected to the coupling node rl (refer to FIG. 1), a wiring line electrically connected to the power voltage Vdd (refer to FIG. 1), a wiring line electrically connected to the control node pu (refer to FIG. 1), a wiring line electrically connected to the control node wl (refer to FIG. 1), and a wiring line electrically connected to reference potential Vss.

Figure 21:
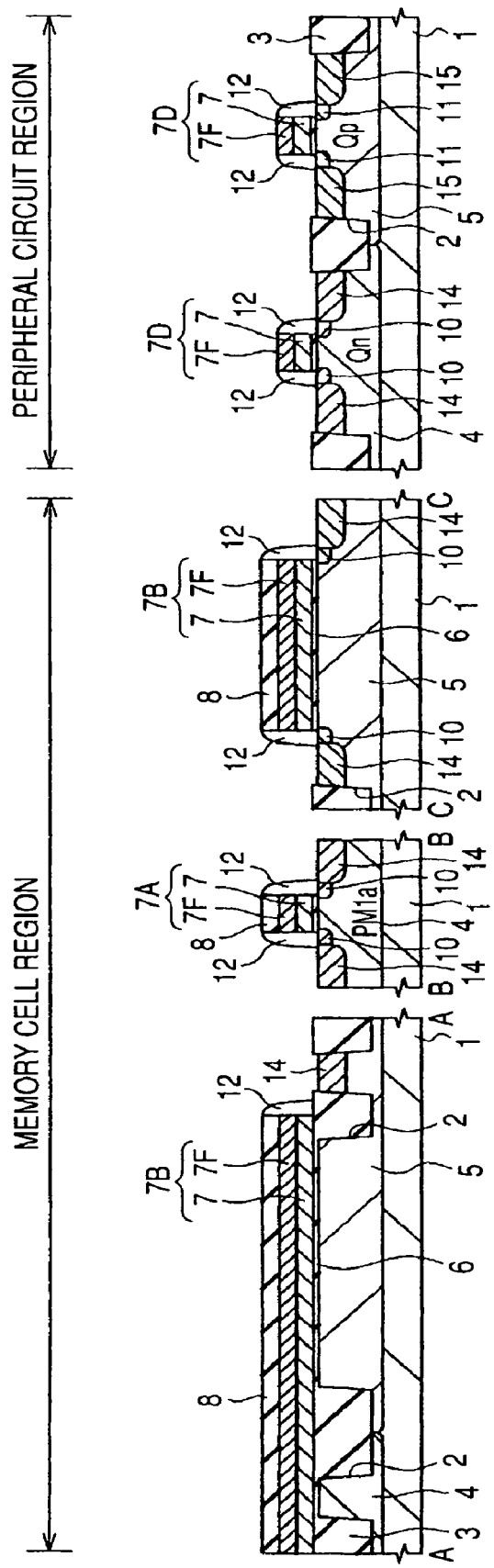
FIG. 21 is a cross section view of a relevant part during the manufacturing process of the semiconductor device of the embodiment 1 of the invention.

While a case that the gate electrodes 7A, 7B, 7C and 7D were formed from the polycrystalline silicon film 7 was described in the embodiment 1, as shown in FIG. 21, the gate electrodes 7A, 7B, 7C and 7D may be formed from a stacked film of the polycrystalline silicon film 7 and a WSi (tungsten silicide) film 7F, and again in that case, similar effects can be obtained. In this case, the silicide layer 18 (for example, refer to FIG. 13) may be omitted.

Embodiment 2

Next, a structure of a nonvolatile memory of embodiment 2 is described together with a manufacturing process of the memory using FIGS. 22 to 31. Since a planar structure of a memory cell of the nonvolatile memory of the embodiment 2 is approximately the same as a plane structure of the memory cell shown in the embodiment, the planar structure is omitted to be shown in the embodiment 2. In each of cross section views shown in FIGS. 22 to 31, a portion marked with a reference B shows a cross section of the memory cell along the line B-B in each of plane views used in the embodiment 1, a portion marked with a reference C shows a cross section of the memory cell along the line C-C in each of corresponding plane views used in the embodiment 1, and other portions show cross sections of part of the peripheral circuit region. In the peripheral circuit region shown in FIGS. 22 to 31, an n-channel MISFET and a p-channel MISFET, which configure a peripheral circuit, and a resistance element are formed. That is, in description with FIG. 22 as an example, a cross section view of a memory cell along a line B-B of each plane view, a cross section view of a memory cell along a line C-C of each plane view, the peripheral circuit region in which the n-channel MISFET and the p-channel MISFET are formed, and a resistance element formation region are shown from the left in FIG. 22.

Figure 22:
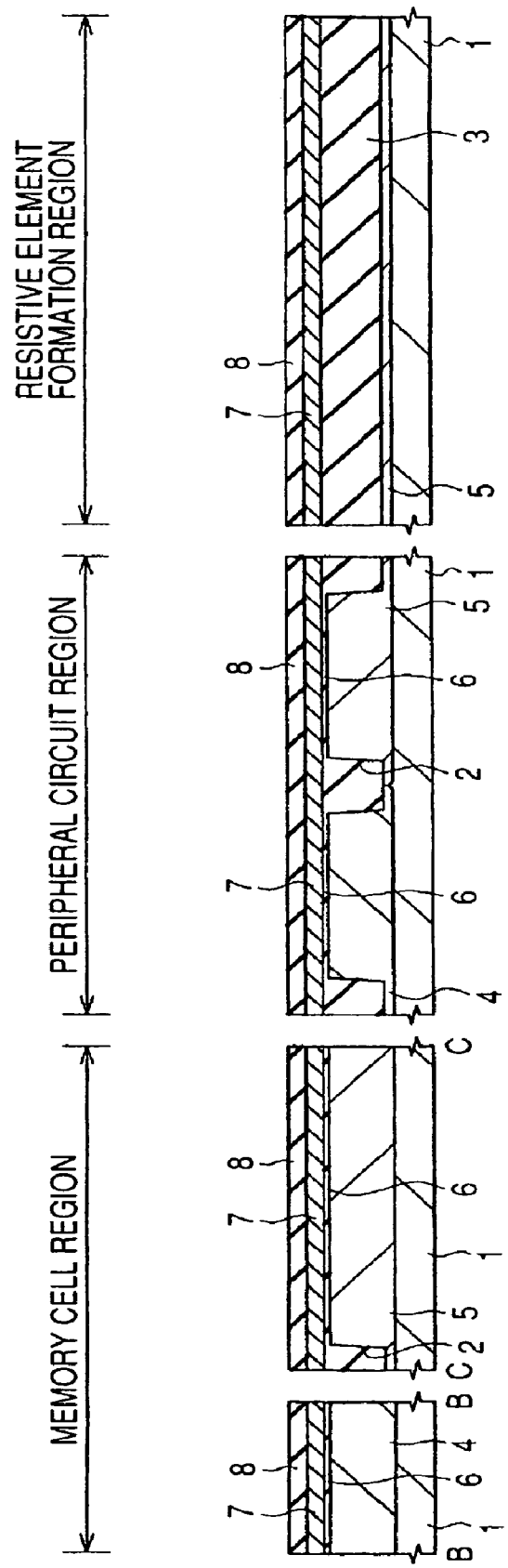
FIG. 22 is a cross section view of a relevant part for explaining a method of manufacturing a semiconductor device of embodiment 2 of the invention.
Figure 23:
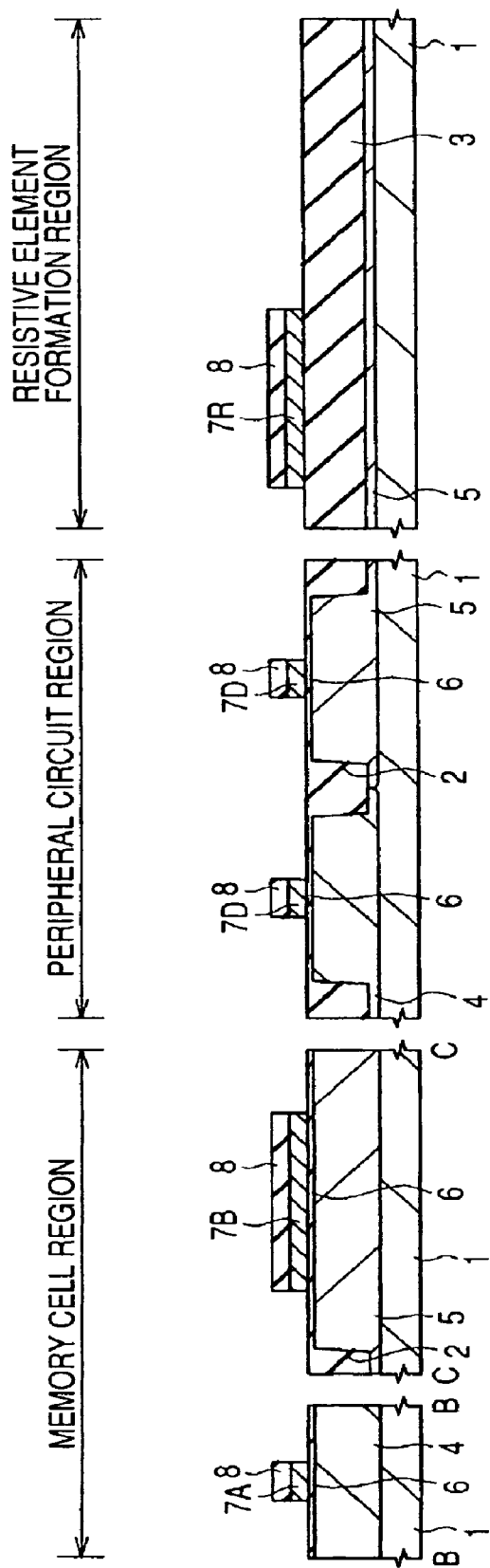
FIG. 23 is a cross section view of a relevant part during a manufacturing process of the semiconductor device following FIG. 22.

A manufacturing process of the nonvolatile memory of the embodiment 2 has the same steps as steps described using FIGS. 3 to 6 in the embodiment 1 (refer to FIG. 22). After that, as shown in FIG. 23, an insulating film (sixth insulating film) 8 is patterned by dry etching using a photoresist film (omitted to be shown) patterned by a photolithography technique as a mask. A polycrystalline silicon film 7 is patterned using the patterned insulating film 8 as a mask, so that gate electrodes 7A (refer to FIG. 9 and FIG. 10), 7B and 7C (refer to FIG. 10), and 7D, and a resistance element 7R are formed. The resistance element 7R is formed on the silicon oxide film 3. That is, the resistance element 7R is formed in a step of forming the gate electrodes 7A, 7B, and the gate electrode 7C of the n-channel MISFETs TR1 to TR4 in the memory cell region, and the gate electrode 7D in the peripheral circuit region. Thus, the manufacturing process can be simplified, and increase in the number of masks can be prevented.

Figure 24:
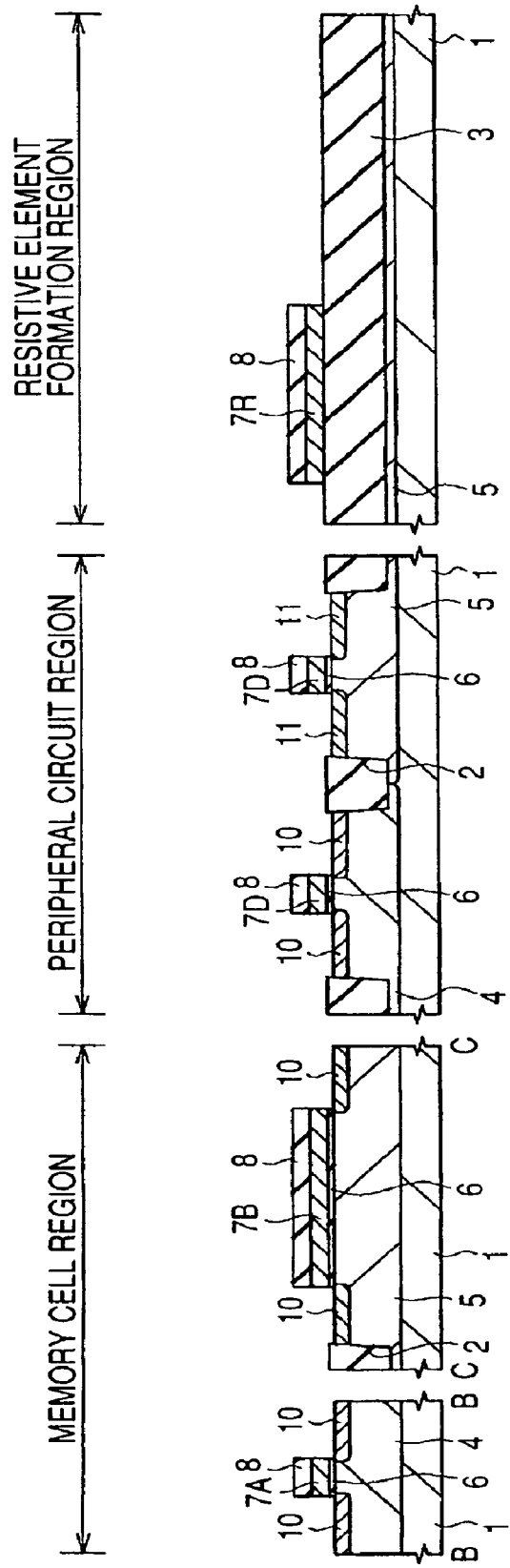
FIG. 24 is a cross section view of a relevant part during the manufacturing process of the semiconductor device following FIG. 23.

Next, as shown in FIG. 24, for example, a p-type well 4 is subjected to ion implantation of phosphorous or arsenic as an n-type impurity, thereby an $n^+$-type semiconductor region 10 in a comparatively low concentration is formed, and an n-type well 5 is subjected to ion implantation of boron as a p-type impurity, thereby a $p^-$-type semiconductor region 11 in a comparatively low concentration is formed.

Figure 25:
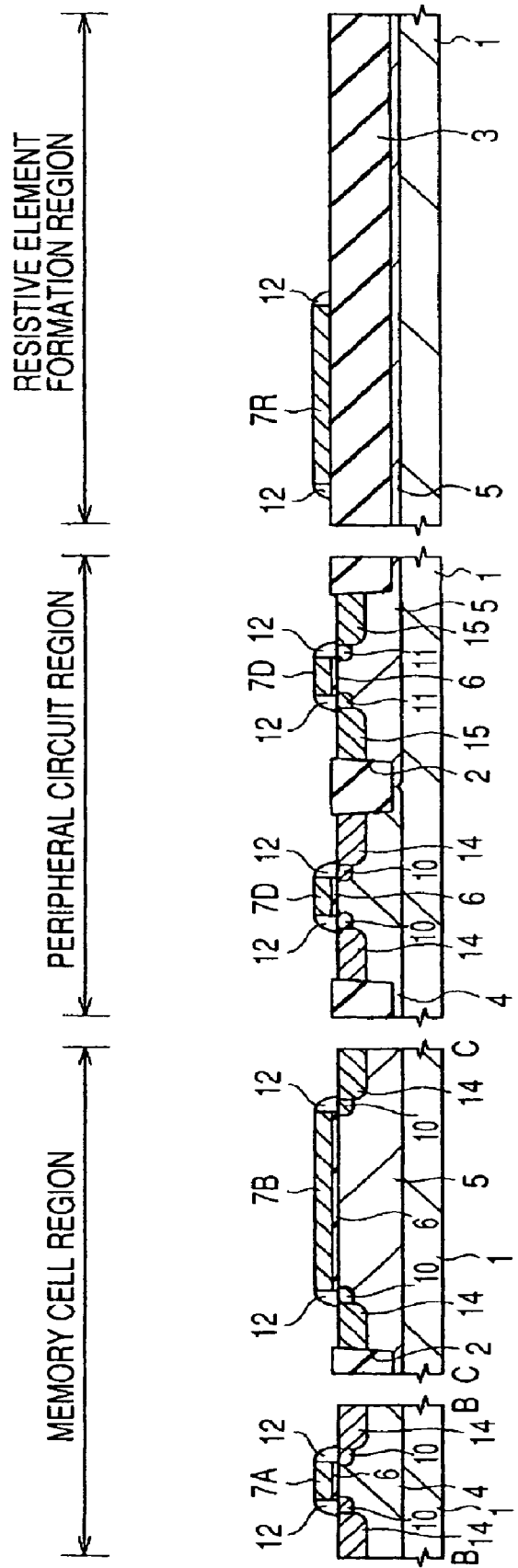
FIG. 25 is a cross section view of a relevant part during the manufacturing process of the semiconductor device following FIG. 24.

Next, as shown in FIG. 25, a silicon oxide film is deposited on a substrate 1 by the CVD process, then the silicon oxide film is anisotropically etched, thereby sidewall spacers 12 are formed on sidewalls of the gate electrodes 7A, 7B, 7C and 7D and the resistance element 7R. By anisotropic etching in formation of the sidewall spacers 12, the insulating film 8 formed on the gate electrodes 7A, 7B, 7C and 7D, and on the resistance element 7R is removed.

Next, the p-type well 4 is subjected to ion implantation of phosphorous or arsenic as an n-type impurity, thereby an $n^+$-type semiconductor region 14 in a comparatively high concentration is formed, and the n-type well 5 is subjected to ion implantation of boron as a p-type impurity, thereby a $p^+$-type semiconductor region 15 in a comparatively high concentration is formed. The $n^+$-type semiconductor region 14 configures respective sources and drains of the MISFETs PM1a (refer to FIG. 1) and PM2a (refer to FIG. 1), readout MISFETs DM1 (refer to FIG. 1) and DM2 (refer to FIG. 1), n-channel MISFETs TR1 to TR4 (refer to FIG. 1), and n-channel MISFETs formed in the peripheral circuit region. Furthermore, the $n^+$-type semiconductor region 14 is formed for configuring the control gate cg of the MIS capacitance elements PM1b and PM2b. The $p^+$-type semiconductor region 15 configures sources and drains of the p-channel MISFETs formed in the peripheral circuit region.

Figure 26:
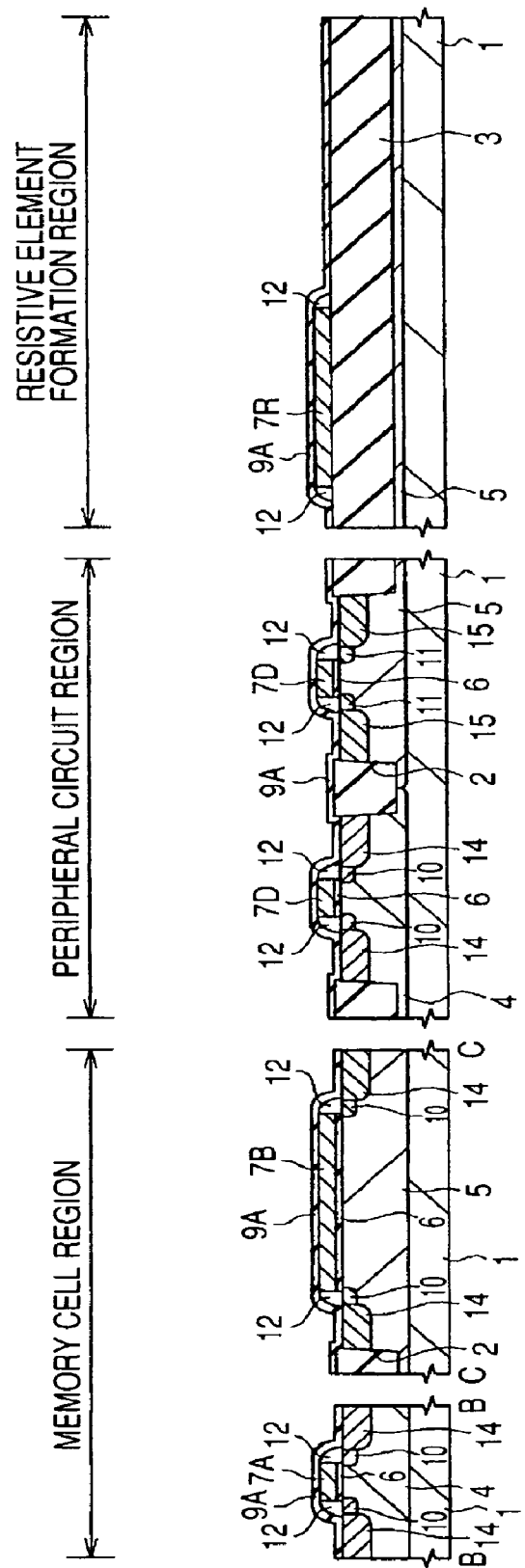
FIG. 26 is a cross section view of a relevant part during the manufacturing process of the semiconductor device following FIG. 25.
Figure 27:
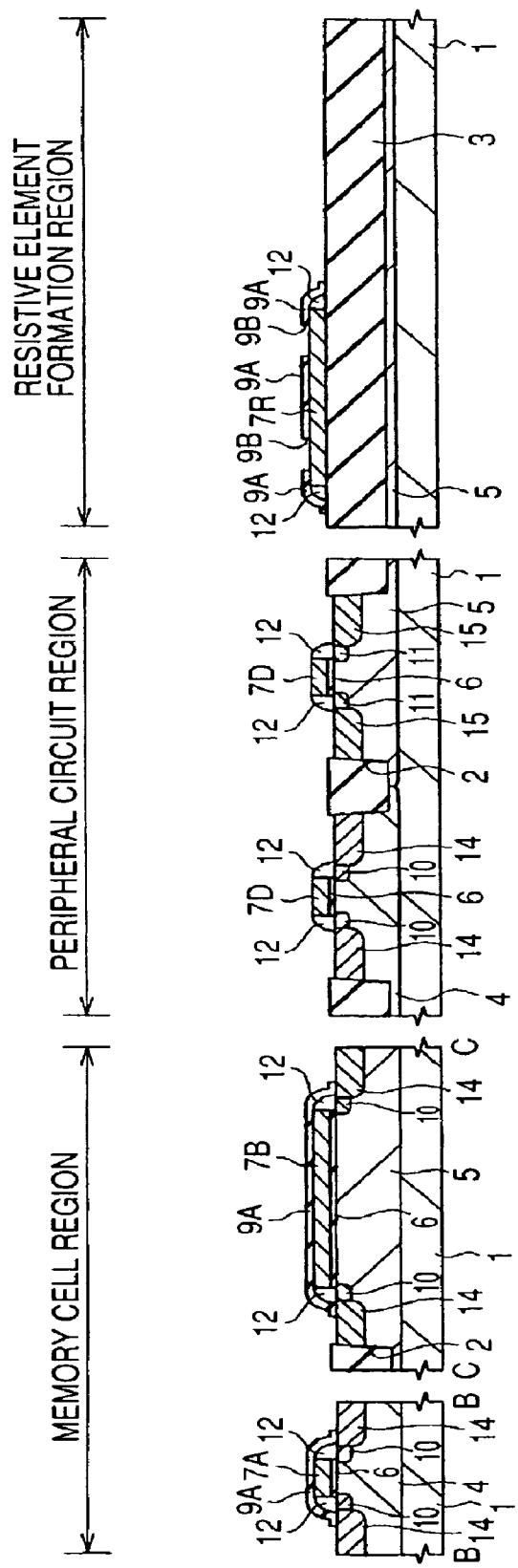
FIG. 27 is a cross section view of a relevant part during the manufacturing process of the semiconductor device following FIG. 26.

Next, as shown in FIG. 26, a silicon oxide film (second insulating film) 9A about 10 nm or more in thickness is deposited on the substrate 1 by the CVD process. Then, as shown in FIG. 27, the insulating film 9A is patterned by dry etching using a photoresist film (omitted to be shown) patterned by a photolithography technique as a mask. Thus, the insulating film 9A is left on tops and sides of the gate electrodes 7A, 7B and 7C (refer to FIG. 10) and the resistance element 7R. An opening 9B penetrated to the resistance element 7R is formed in the insulating film 9A on the resistance element 7R. Here, the opening 9B is provided for forming a silicide layer 18 formed on a surface of the resistance element 7R in a subsequent step. That is, in the embodiment 2, in a step of forming the insulating film 9A formed for providing the opening 9B on the resistance element 7R, the insulating film 9A is formed on the gate electrodes 7A and 7B in the memory cell region. Thus, the manufacturing process can be simplified, and increase in the number of masks can be prevented.

Figure 28:
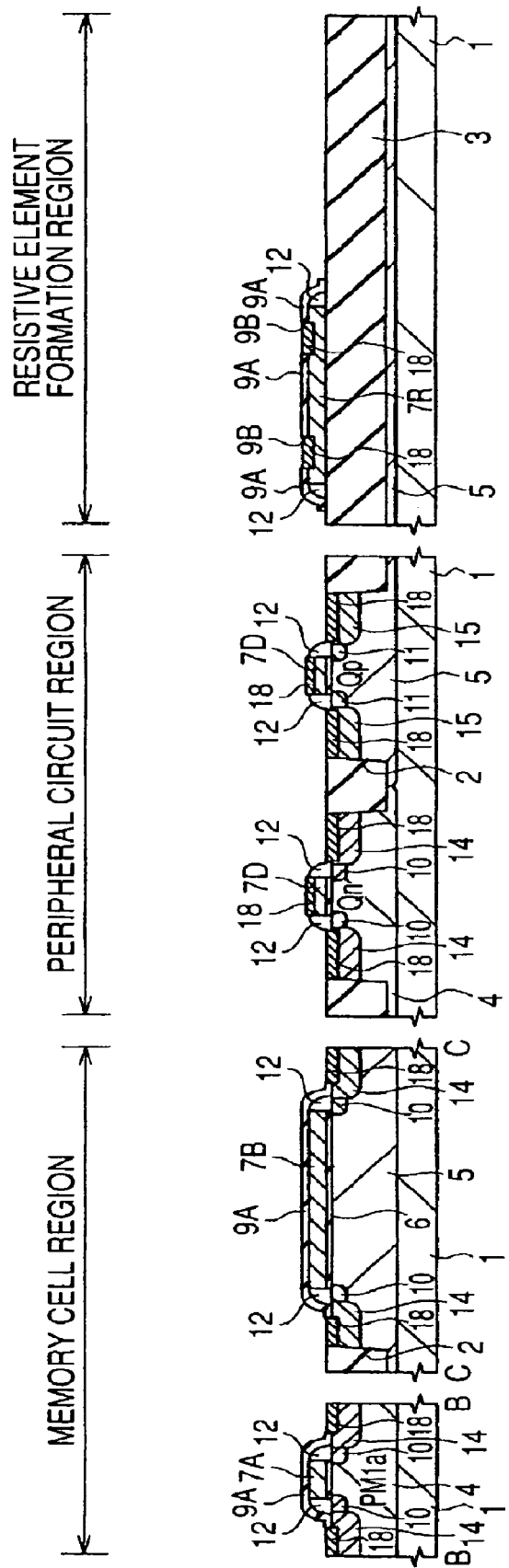
FIG. 28 is a cross section view of a relevant part during the manufacturing process of the semiconductor device following FIG. 27.

Next, as shown in FIG. 28, a silicide layer 18 is formed. A method of forming the silicide layer 18 is the same as that in the embodiment 1: first, for example, a Co film is deposited on the substrate 1 by the sputtering process. Then, the substrate 1 is subjected to heat treating to induce a silicide reaction at an interface between the Co film and the gate electrode 7D in the peripheral circuit region, an interface between the Co film and the resistance element 7R on a bottom of the opening 9B, and an interface between the Co film and the substrate 1, then an unreacted Co film is removed by etching. Thus, the silicide layer 18 as a silicide layer is formed on the surface of the gate electrode 7D, a surface of the resistance element 7R on the bottom of the opening 9B and surfaces of the sources and drains ($n^+$-type semiconductor regions 14 and $p^+$-type semiconductor regions 15). As a result of steps as above, the MISFETs PM1a (refer to FIG. 1), PM2a (refer to FIG. 1) and the MIS capacitance elements PM1b (refer to FIG. 1), PM2b (refer to FIG. 1), which form nonvolatile memory elements PM1 (refer to FIG. 1), PM2 (refer to FIG. 1), readout MISFETs DM1 (refer to FIG. 1), DM2 (refer to FIG. 1), and n-channel MISFETs TR1 to TR4 (refer to FIG. 1) are formed in the memory cell, and a p-channel MISFET Qp and an n-channel MISFET Qn are formed in the peripheral circuit region.

Figure 29:
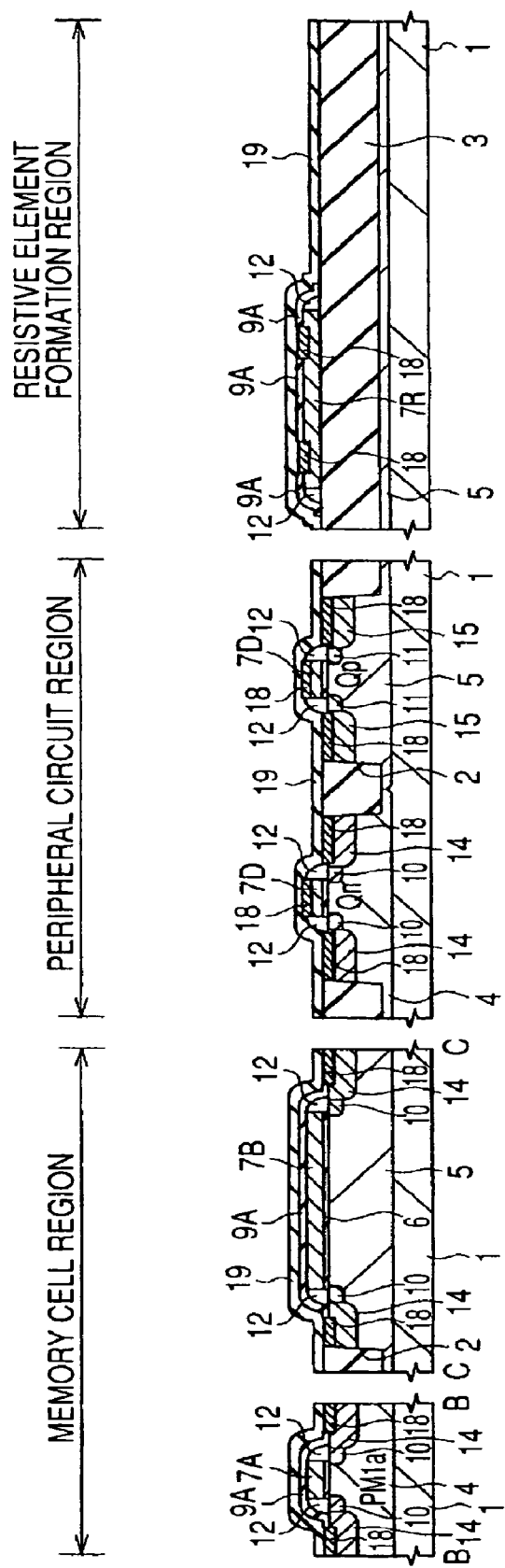
FIG. 29 is a cross section view of a relevant part during the manufacturing process of the semiconductor device following FIG. 28.

Next, as shown in FIG. 29, a silicon nitride film 19 is deposited on the substrate 1 by the plasma enhanced CVD process. Similarly to the embodiment 1, an approach can be exemplified in the embodiment 2, in which the silicon nitride film 19 is formed by using a mixture of $SiH_4$ and $N_2$ as deposition gas, and performing plasma decomposition of the deposition gas.

Again in the embodiment 2, the sidewall spacer 12 or the insulating film 9A made of a silicon oxide film (highly insulative compared with the silicon nitride film 19), which hardly allows leakage of electric charges compared with the silicon nitride film 19, is formed between the silicon nitride film 19 and the gate electrodes 7A and 7B. In the sides of the gate electrodes 7A and 7B, the sidewall spacer 12 and the insulating film 9A are disposed in a stacked condition between the silicon nitride film 19 and the gate electrodes 7A, 7B. Therefore, since the electric charges stored in the gate electrodes 7A, 7B are hardly allowed to leak, reduction in the data holding property of the nonvolatile memory of the embodiment 2 can be prevented further securely. That is, reliability of the semiconductor device can be improved.

Figure 30:
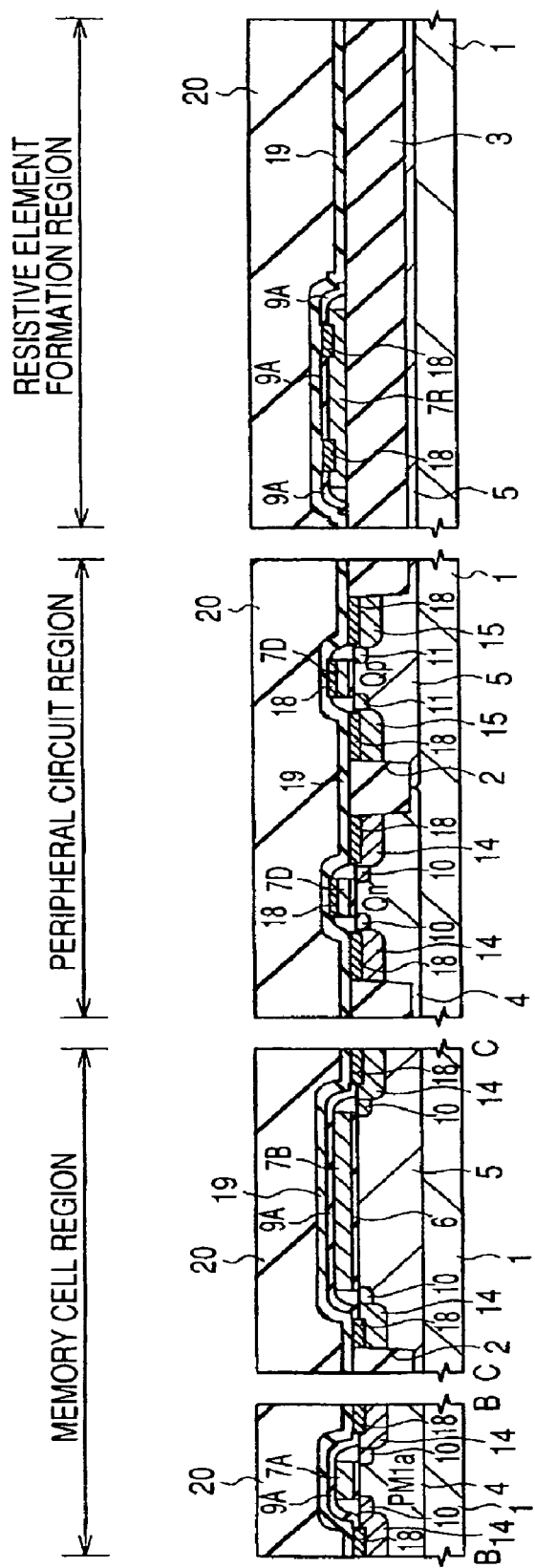
FIG. 30 is a cross section view of a relevant part during the manufacturing process of the semiconductor device following FIG. 29.
Figure 31:
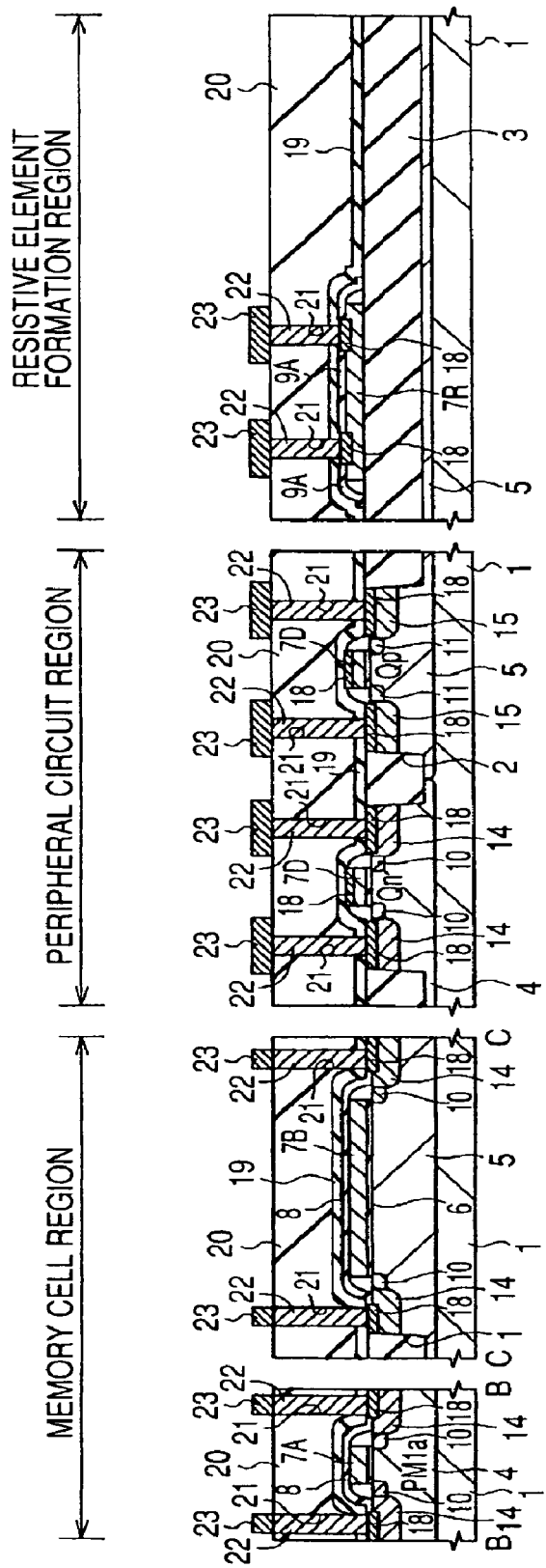
FIG. 31 is a cross section view of a relevant part during the manufacturing process of the semiconductor device following FIG. 30.

Next, as shown in FIG. 30, a silicon oxide film 20 is deposited on the substrate 1 by, for example, the CVD process, then a surface of the silicon oxide film 20 is planarized by the chemical mechanical polishing process. Then, as shown in FIG. 31, the silicon oxide film 20 is subjected to dry etching using a photoresist film as a mask, thereby contact holes 21 are formed, which are penetrated to each of the $n^+$-type semiconductor region 14, the $p^+$-type semiconductor region 15, and the resistance element 7R. At that time, the silicon nitride film 19 works as an etching stopper film in etching the silicon oxide film 20. Then, plugs 22 similar to the plugs 22 as shown in the embodiment 1 (refer to FIG. 16 and FIG. 17) are formed within the contact holes 21. Then, a plurality of wiring lines 23 similar to the wiring lines 23 as shown in the embodiment 1 (refer to FIG. 18 and FIG. 19) are formed on the silicon oxide film 20 and the plugs 22. After that, a semiconductor device of the embodiment 2 is manufactured through the same steps as steps described using FIG. 20 in the embodiment 1.

According to the embodiment 2, the same effects as in the embodiment 1 can be obtained.

Furthermore, according to the embodiment 2, the resistance element can be concurrently formed in the step of forming the gate electrodes of the MISFETs in the memory cell region and the peripheral circuit region. Moreover, the insulating film 9A can be formed on the gate electrodes 7A and 7B in the memory cell region in the step of forming the insulating film 9A formed for providing the openings 9B on the resistance element 7R. Thus, the manufacturing process can be simplified, and increase in the number of masks can be prevented.

Embodiment 3

Next, a structure of a nonvolatile memory of embodiment 3 is described together with a manufacturing process of the memory using FIGS. 32 to 52. In each of cross section views shown in FIGS. 32 to 52, a portion marked with a reference A shows a cross section of a memory cell along a line A-A in a corresponding plane view, a portion marked with a reference B shows a cross section of a memory cell along a line B-B in a corresponding plane view, and other portions show cross sections of part of the peripheral circuit region. In the peripheral circuit region shown in FIGS. 32 to 52, an n-channel MISFET configuring a peripheral circuit, a capacitance element, and a resistance element are formed. In a p-channel MISFET configuring the peripheral circuit, a conduction type is merely inverted and a structure is approximately the same with respect to the n-channel MISFET, therefore a region where the p-channel MISFET is formed is omitted to be shown in each cross section view in the embodiment 3.

Figure 32:
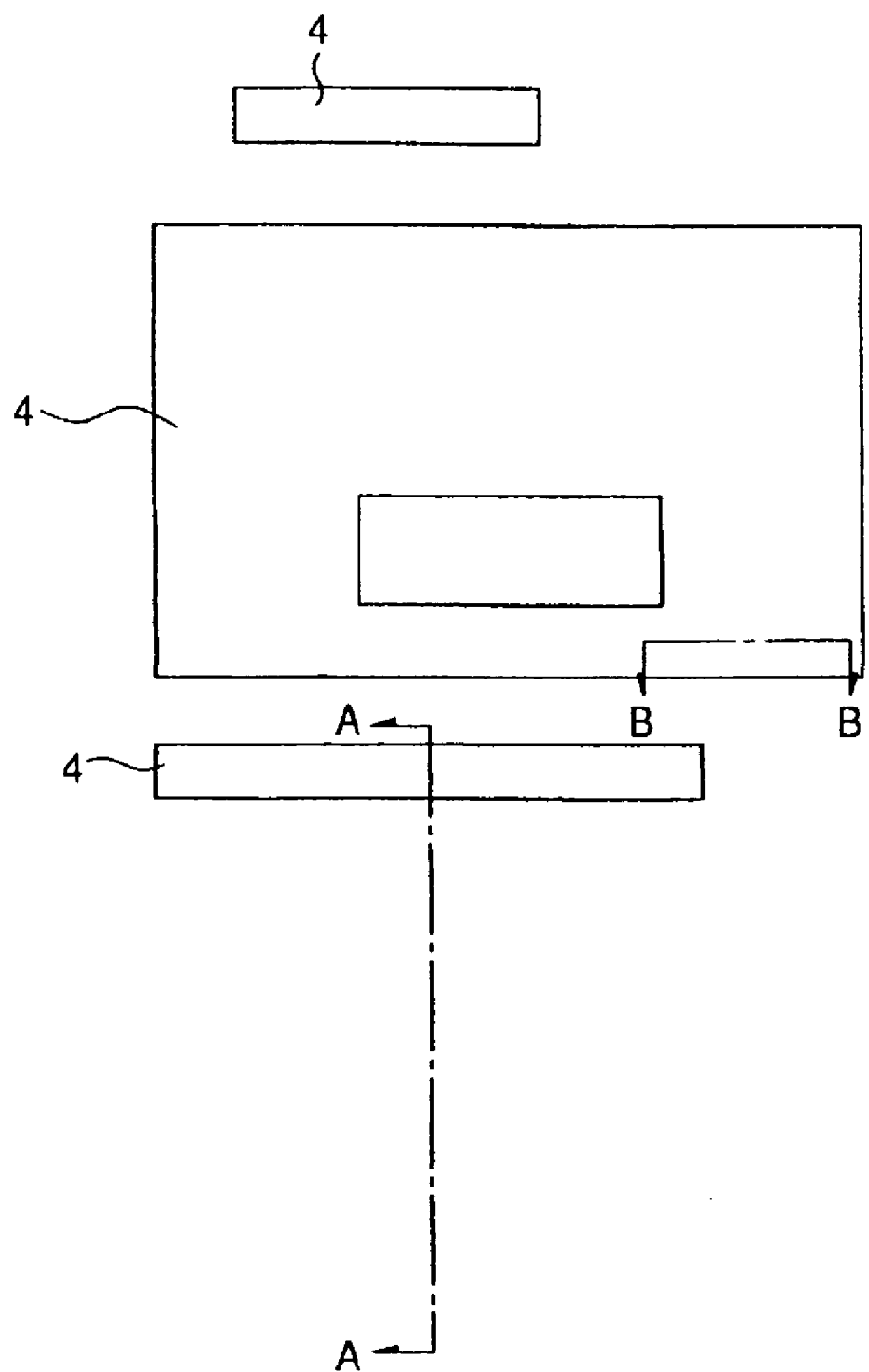
FIG. 32 is a plane view of a relevant part for explaining a method of manufacturing a semiconductor device of embodiment 3 of the invention.
Figure 33:
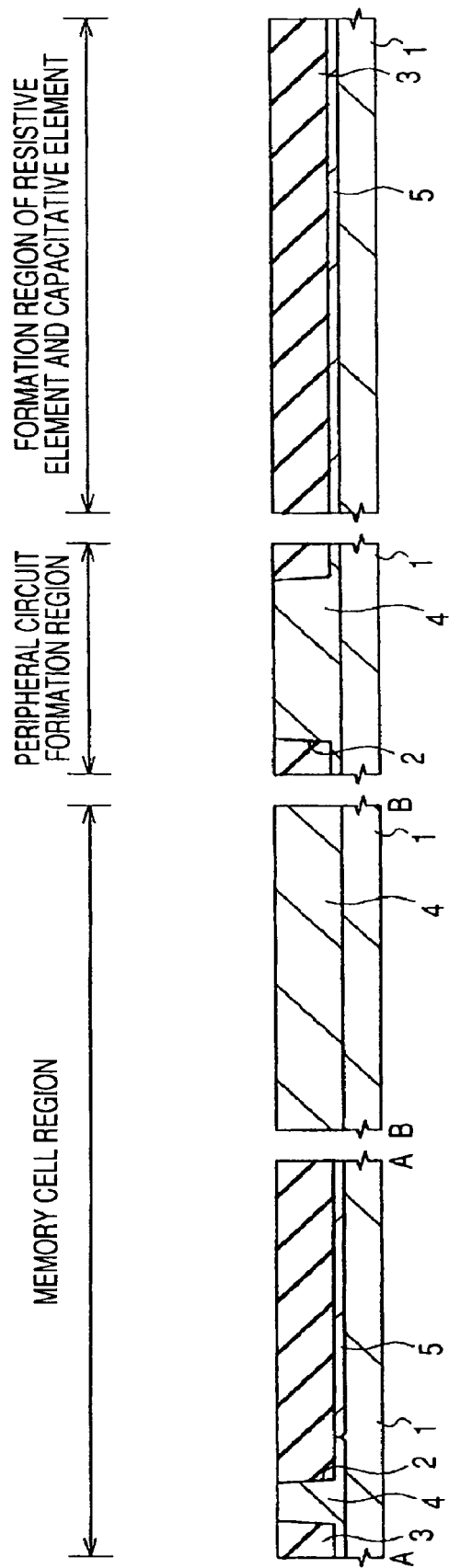
FIG. 33 is a cross section view of a relevant part for explaining the method of manufacturing the semiconductor device of the embodiment 3 of the invention.

First, element isolation grooves 2, p-type wells 4, and n-type wells 5 are formed according to the same steps as steps described using FIG. 3 and FIG. 4 in the embodiment 1 (refer to FIG. 32 and FIG. 33).

Figure 34:
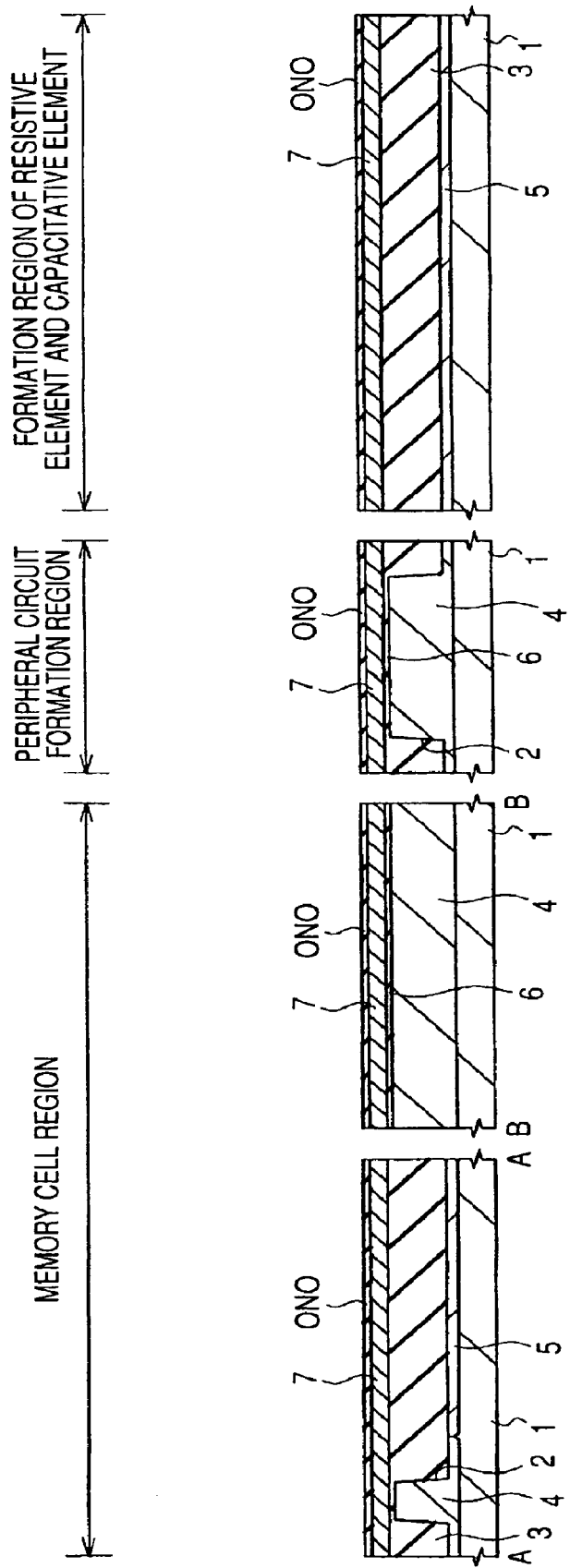
FIG. 34 is a cross section view of a relevant part during a manufacturing process of the semiconductor device following FIG. 33.

Next, as shown in FIG. 34, the substrate 1 is thermally oxidized so that gate insulating films 6 including, for example, silicon oxide are formed on respective surfaces of the p-type wells 4 and the n-type wells 5. Then, polycrystalline silicon films 7 are formed as conductive films on the gate insulating films 6 by, for example, the CVD process. Then, insulating films (fourth insulating films) ONO are formed on the polycrystalline silicon films 7. The insulating film ONO is formed by sequentially depositing a silicon oxide film about 5 nm in thickness, silicon nitride film about 20 nm in thickness, and silicon oxide film about 5 nm in thickness from a lower layer.

Figure 35:
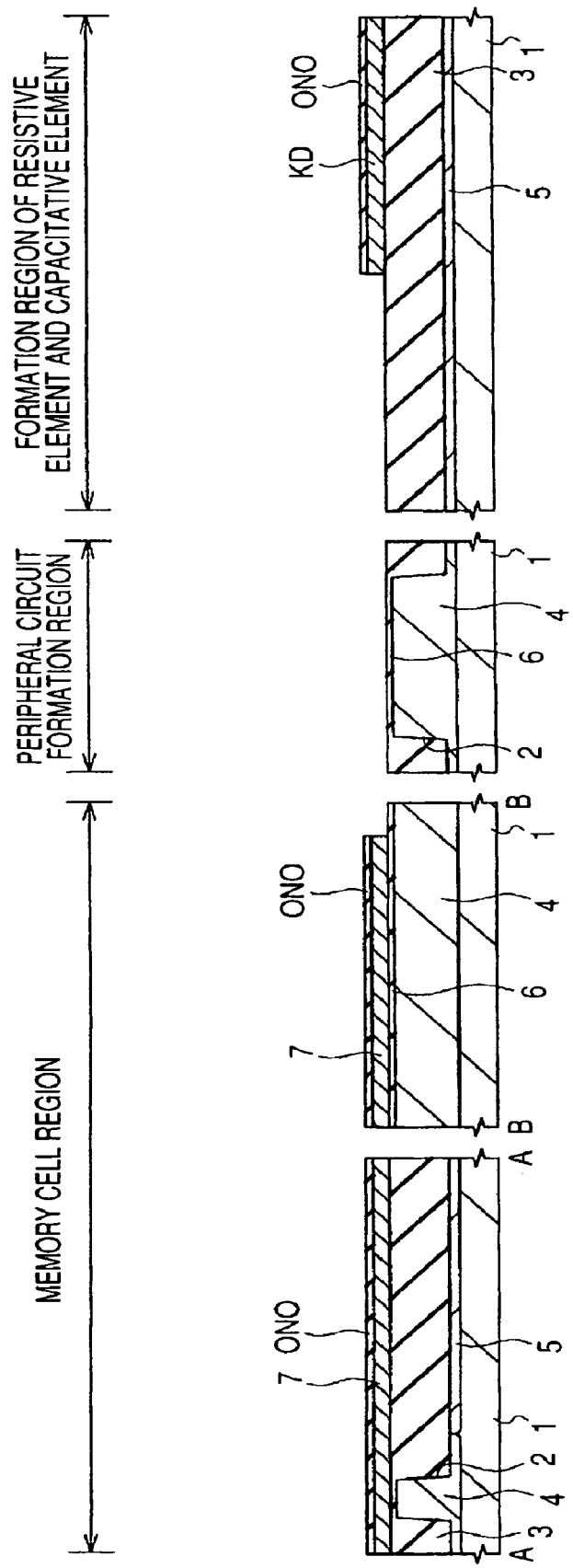
FIG. 35 is a cross section view of a relevant part during the manufacturing process of the semiconductor device following FIG. 34.

Next, as shown in FIG. 35, the insulating films ONO and the polycrystalline silicon films 7 are patterned by etching using a photoresist film as a mask. Thus, the insulating films ONO and the polycrystalline silicon films 7 are left in regions where the capacitance elements are formed in the memory cell region and the peripheral circuit region, and removed in other regions. At that time, the polycrystalline silicon film 7 left in the region where the capacitance element is formed in the peripheral circuit region acts as a lower electrode (first capacitance electrode) KD of the capacitance element.

Figure 36:
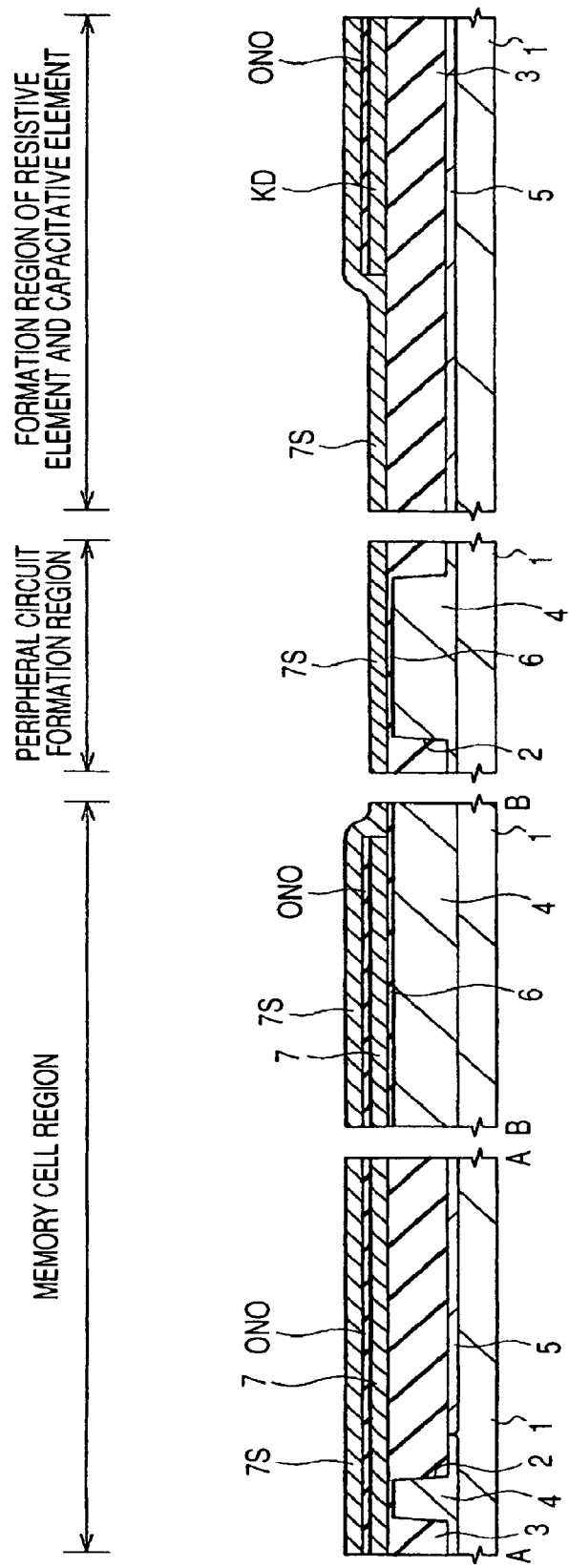
FIG. 36 is a cross section view of a relevant part during the manufacturing process of the semiconductor device following FIG. 35.
Figure 37:
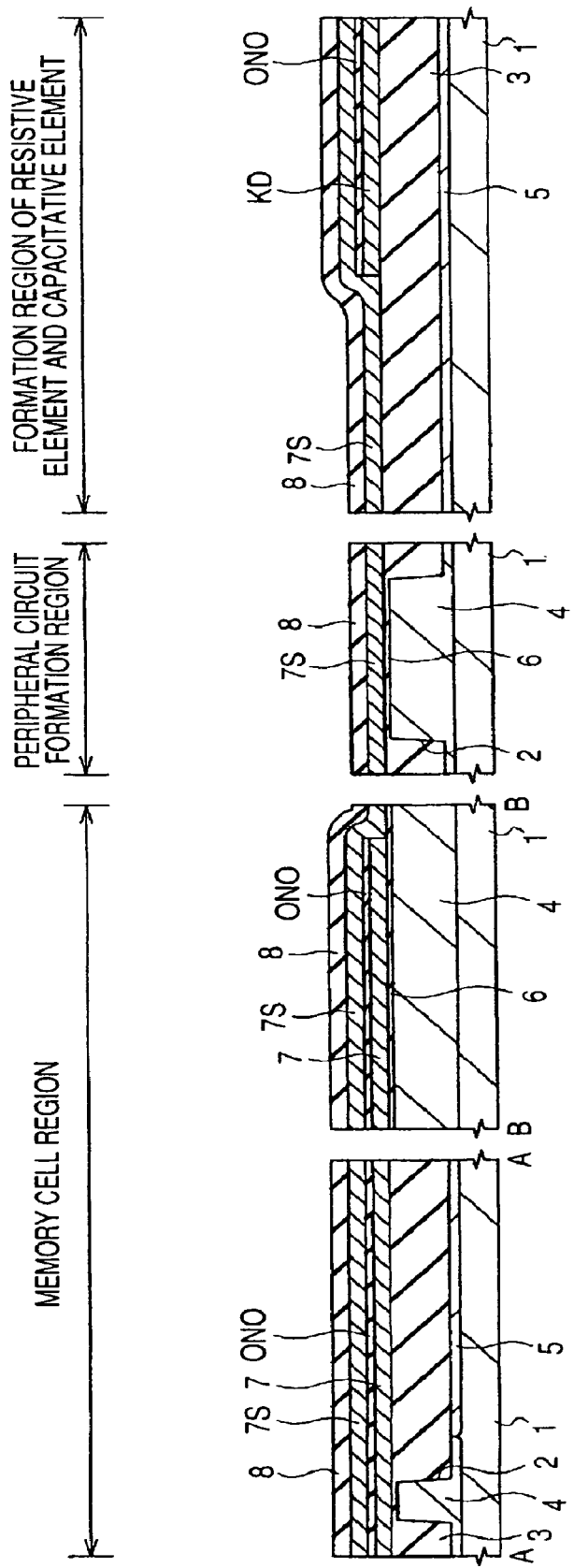
FIG. 37 is a cross section view of a relevant part during the manufacturing process of the semiconductor device following FIG. 36.

Next, as shown in FIG. 36, a polycrystalline silicon film (second conductive film) 7S is deposited on the substrate 1 by, for example, the CVD process. Then, as shown in FIG. 37, an insulating film 8 is deposited on the polycrystalline silicon film 7S by, for example, the CVD process.

Figure 38:
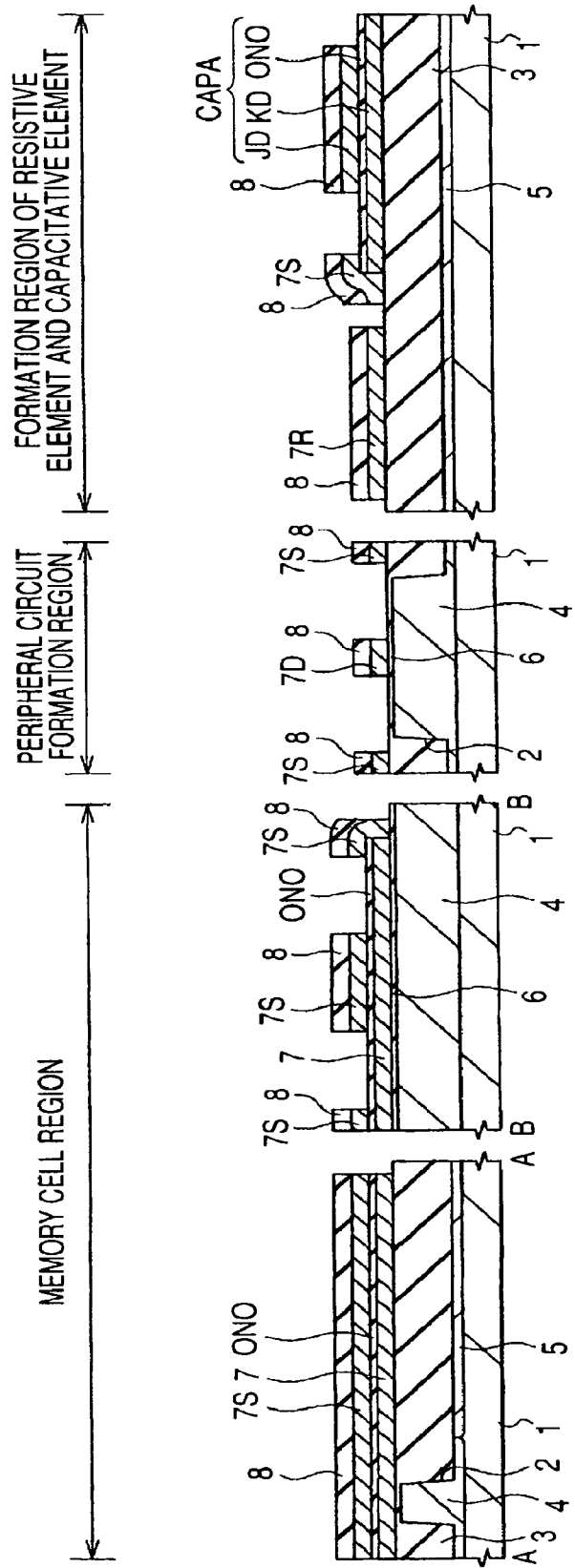
FIG. 38 is a cross section view of a relevant part during the manufacturing process of the semiconductor device following FIG. 37.

Next, as shown in FIG. 38, an insulating film 8 to be a cap film is patterned by etching using a photoresist film as a mask. Then, the polycrystalline silicon film 7S is patterned by dry etching using the cap film 8 as a mask. At that time, the insulating film ONO acts as an etching stopper. Thus, the insulating film 8 and the polycrystalline silicon film 7S are left in a region where the gate electrodes are formed in a subsequent step, and left on element isolation grooves 2 (silicon oxide films 3). At that time, the polycrystalline silicon films 7S left in the memory cell region act as control gates (third electrodes) of nonvolatile memory elements PM1, PM2 (refer to FIG. 1). In the peripheral circuit region, a gate electrode 7D including the polycrystalline silicon film 7S, a resistance element 7R, and an upper electrode (second capacitance electrode) JD of the capacitance element are formed, consequently a capacitance element CAPA with the lower electrode KD and the upper electrode JD as capacitance electrodes, and with the insulating film ONO as a capacitance insulating film.

Figure 39:
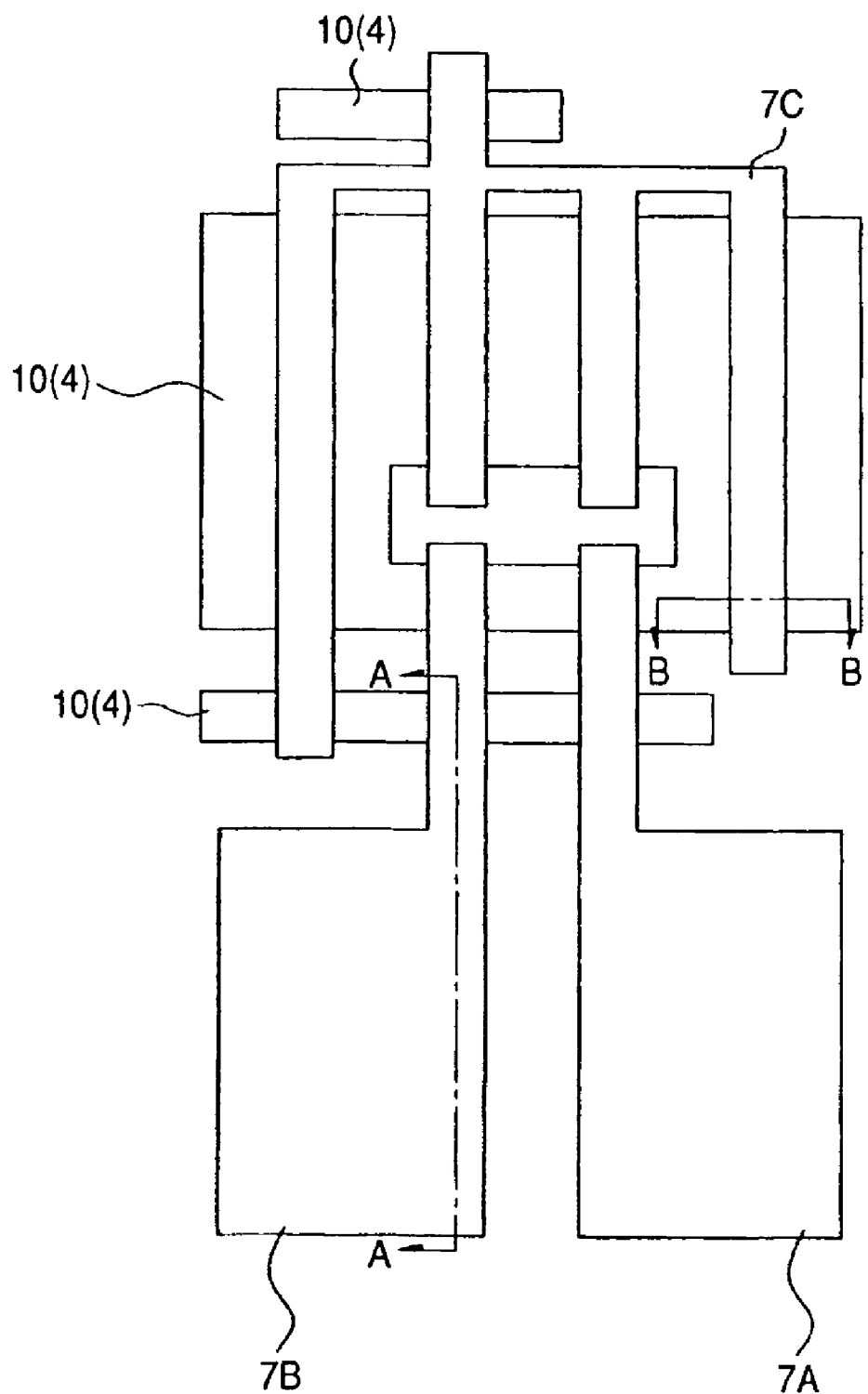
FIG. 39 is a plane view of a relevant part during the manufacturing process of the semiconductor device of the embodiment 3 of the invention.
Figure 40:
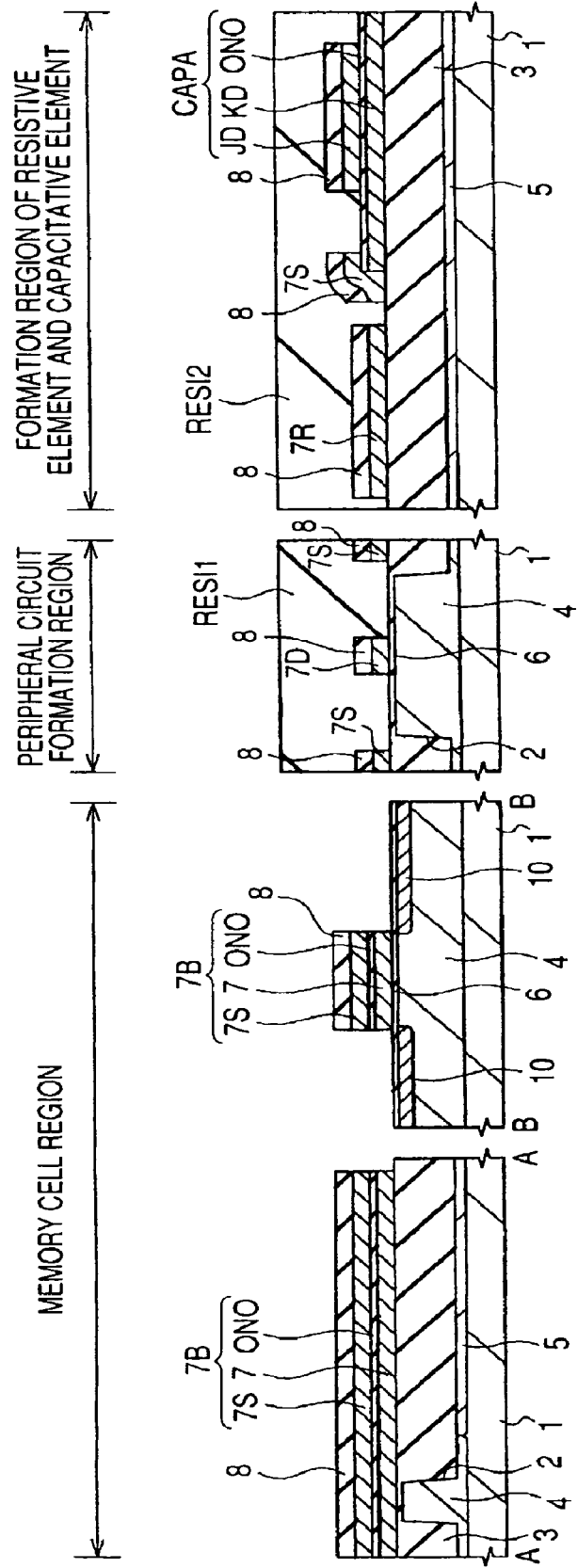
FIG. 40 is a cross section view of a relevant part during the manufacturing process of the semiconductor device following FIG. 38.

Next, as shown in FIG. 39 and FIG. 40, the peripheral circuit region is covered by a photoresist film RESI, and the insulating film ONO and the polycrystalline silicon film 7 are subjected to etching using the photoresist film RESI and the insulating film 8 as a mask. Thus, gate electrodes 7A, 7B and 7C including the polycrystalline silicon film 7, insulating film ONO, and polycrystalline silicon film 7S are formed. Here, the polycrystalline silicon films 7S in the memory cell region configure control gate electrodes of the nonvolatile memory elements PM1 and PM2, and the polycrystalline silicon film 7 configure floating gate electrodes of the nonvolatile memory elements PM1 and PM2.

Then, in the memory cell region, for example, the p-type well 4 and the n-type well 5 are partially subjected to ion implantation of phosphorous or arsenic as an n-type impurity, thereby an n$^-$-type semiconductor region 10 in a comparatively low concentration is formed.

Figure 41:
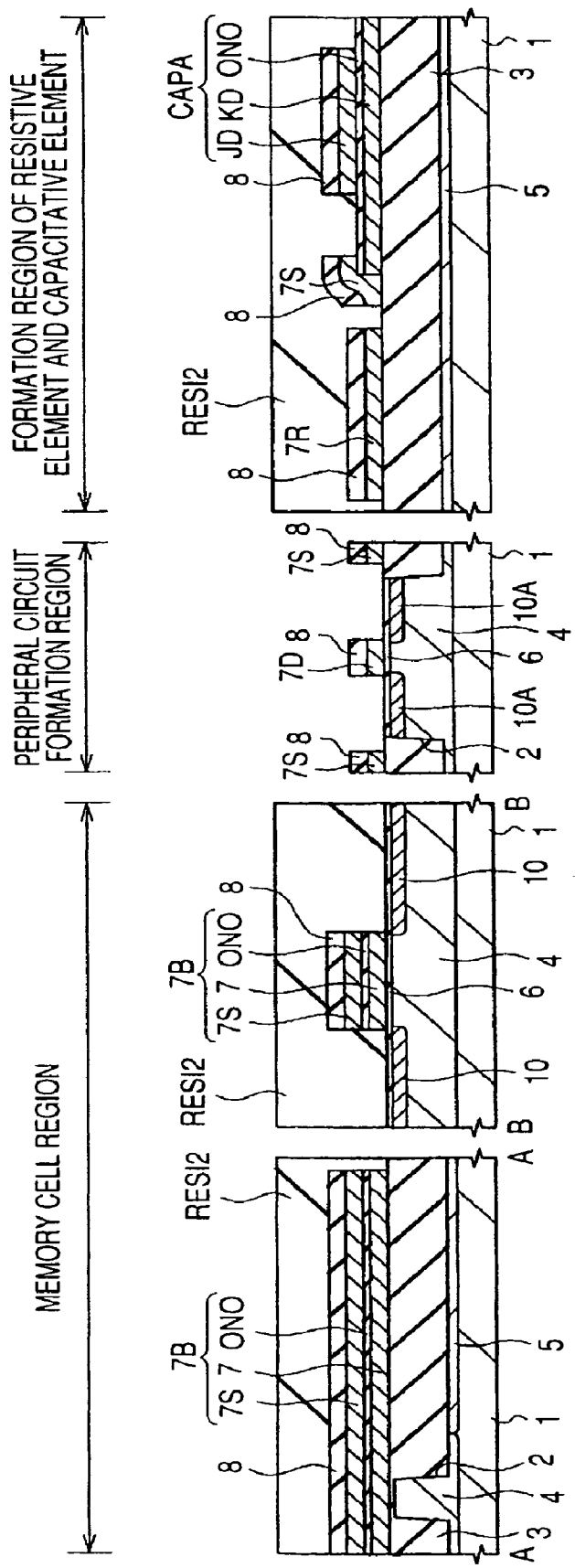
FIG. 41 is a cross section view of a relevant part during the manufacturing process of the semiconductor device following FIG. 40.

Next, as shown in FIG. 41, the memory cell region, and a region where the resistance element 7R and the capacitance element CAPA are formed in the peripheral circuit region are covered by a photoresist film RESI2. Then, for example, the p-type well 4 in the peripheral circuit region is subjected to ion implantation of phosphorous or arsenic as an n-type impurity, thereby an n$^-$-type semiconductor region 10A in a comparatively low concentration is formed, and the n-type well is subjected to ion implantation of boron as an p-type impurity, thereby a p$^-$-type semiconductor region in a comparatively low concentration is formed.

Figure 42:
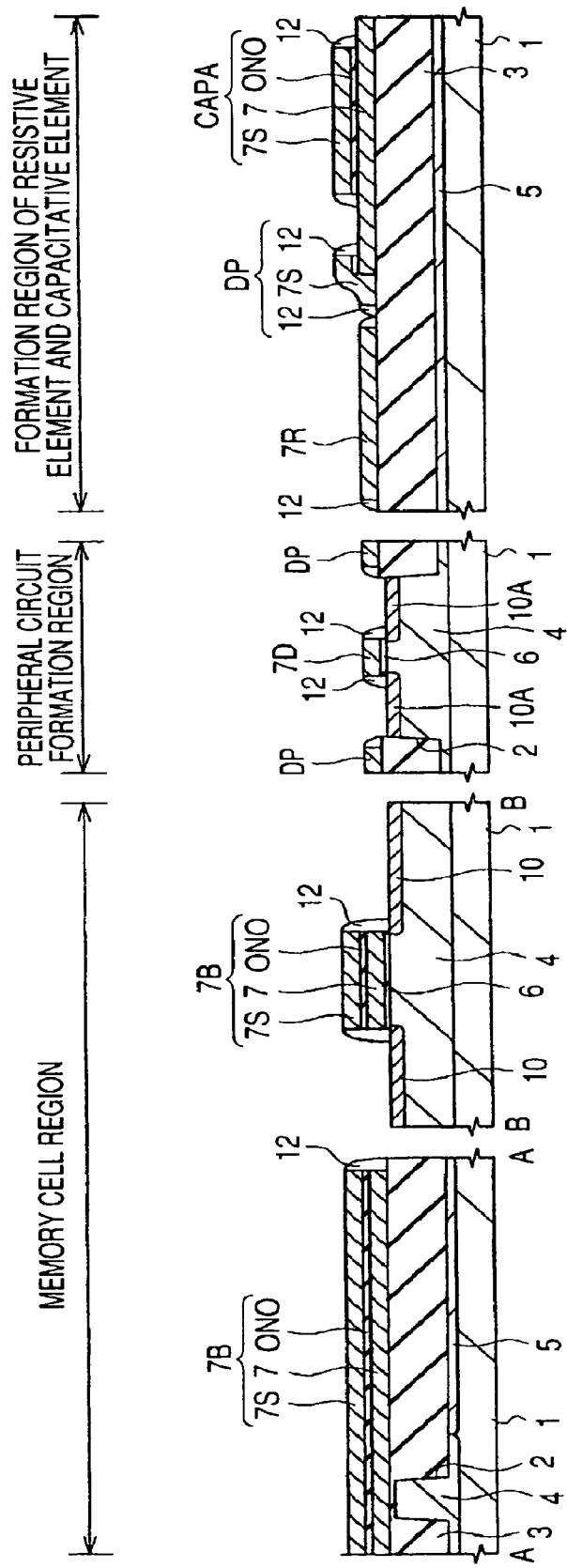
FIG. 42 is a cross section view of a relevant part during the manufacturing process of the semiconductor device following FIG. 41.

Next, as shown in FIG. 42, a silicon oxide film is deposited on the substrate 1 by the CVD process, then the silicon oxide film and the insulating film 8 are anisotropically etched, thereby sidewall spacers 12 are formed on sidewalls of the gate electrodes 7A, 7B, 7C and 7D, resistance element 7R, and capacitance element CAPA. The sidewall spacers 12 are formed also on sidewalls of the polycrystalline silicon patterns left on the element isolation grooves 2, and dummy patterns DP are formed from the polycrystalline silicon patterns and the sidewall spacers 12 on the element isolation grooves 2. The dummy patterns DP work as a mask so that the silicon oxide films 3 in the element isolation grooves 2 are not etched when the silicon oxide film on the substrate 1 is subjected to etching in a subsequent step.

Figure 43:
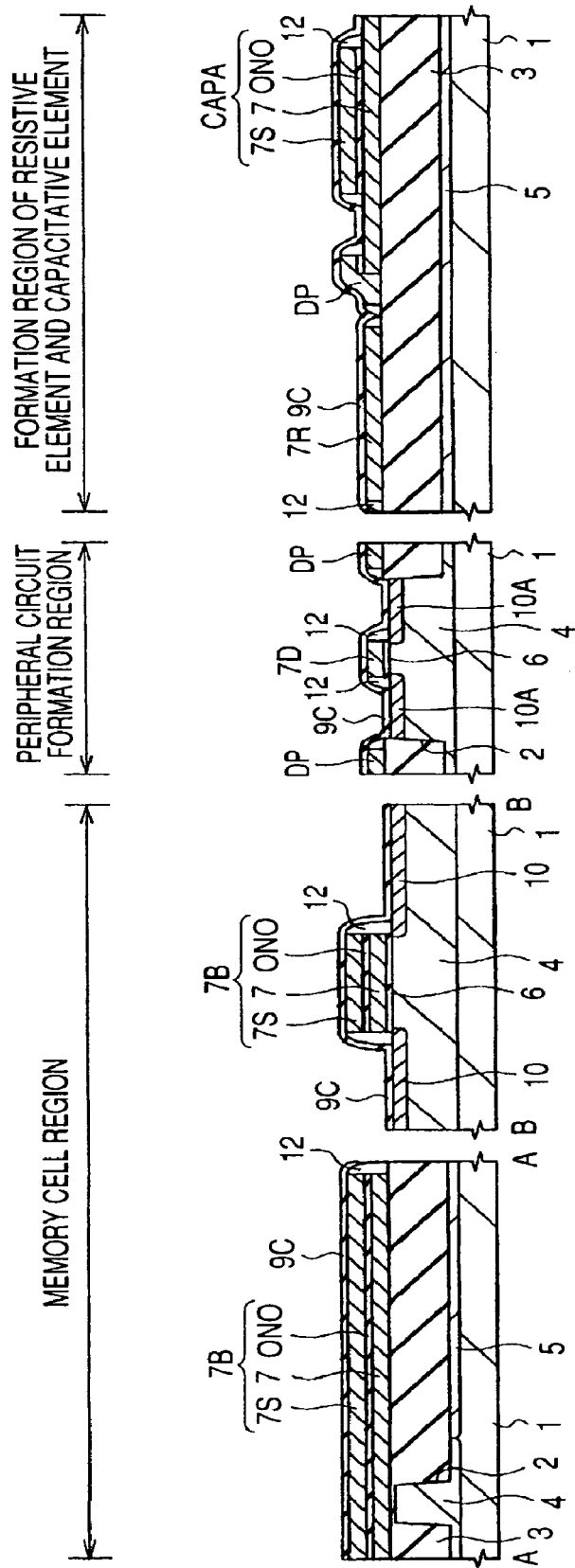
FIG. 43 is a cross section view of a relevant part during the manufacturing process of the semiconductor device following FIG. 42.
Figure 44:
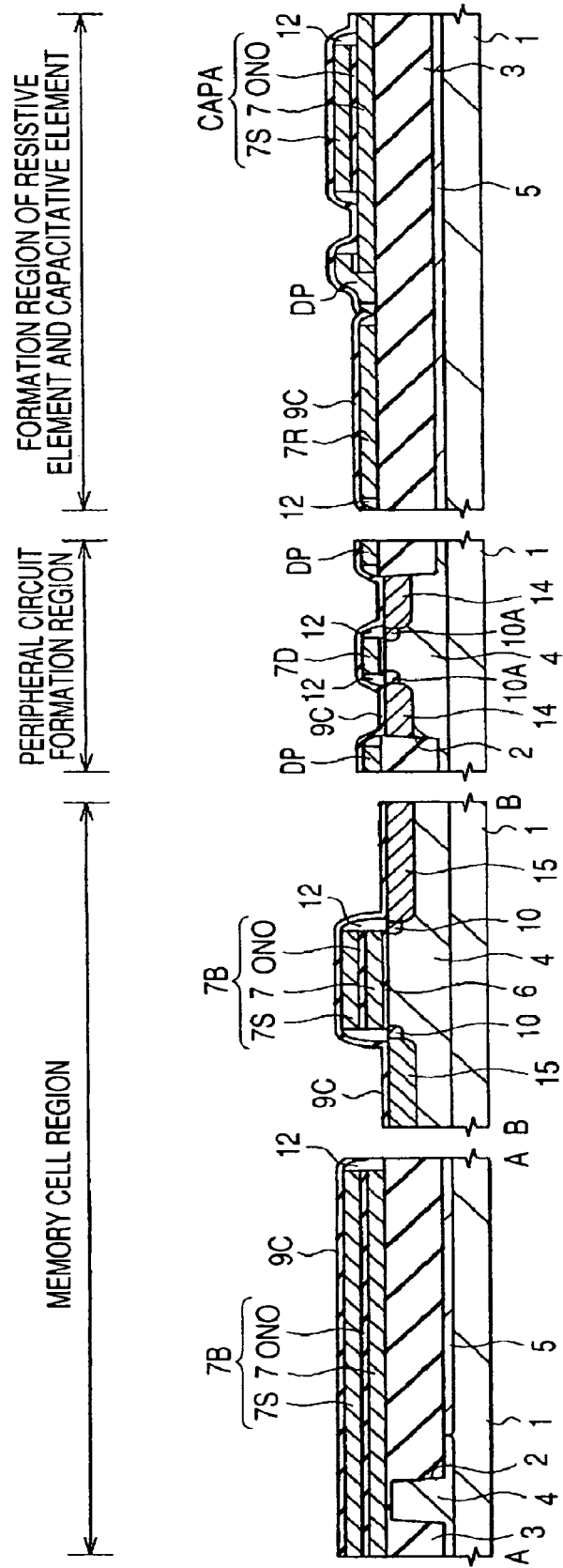
FIG. 44 is a cross section view of a relevant part during the manufacturing process of the semiconductor device following FIG. 43.

Next, as shown in FIG. 43, an insulating film 9C is formed by depositing a silicon oxide film about 20 nm to 30 nm in thickness on the substrate 1 by the CVD process. Then, as shown in FIG. 44, the p-type well 4 and the n-type well 5 are partially subjected to ion implantation of phosphorous or arsenic as an n-type impurity, thereby an n$^+$-type semiconductor region 14 in a comparatively high concentration is formed, and the n-type well 5 is subjected to ion implantation of boron as a p-type impurity, thereby a p$^+$-type semiconductor region 15 in a comparatively high concentration is formed. The n$^+$-type semiconductor region 14 configures respective sources and drains of the MISFETs PM1a (refer to FIG. 1) and PM2a (refer to FIG. 1), readout MISFETs DM1 (refer to FIG. 1) and DM2 (refer to FIG. 1), n-channel MISFETs TR1 to TR4 (refer to FIG. 1), and n-channel MISFETs formed in the peripheral circuit region. The p$^+$-type semiconductor region 15 configures a source and a drain of the p-channel MISFET formed in the peripheral circuit region.

Figure 45:
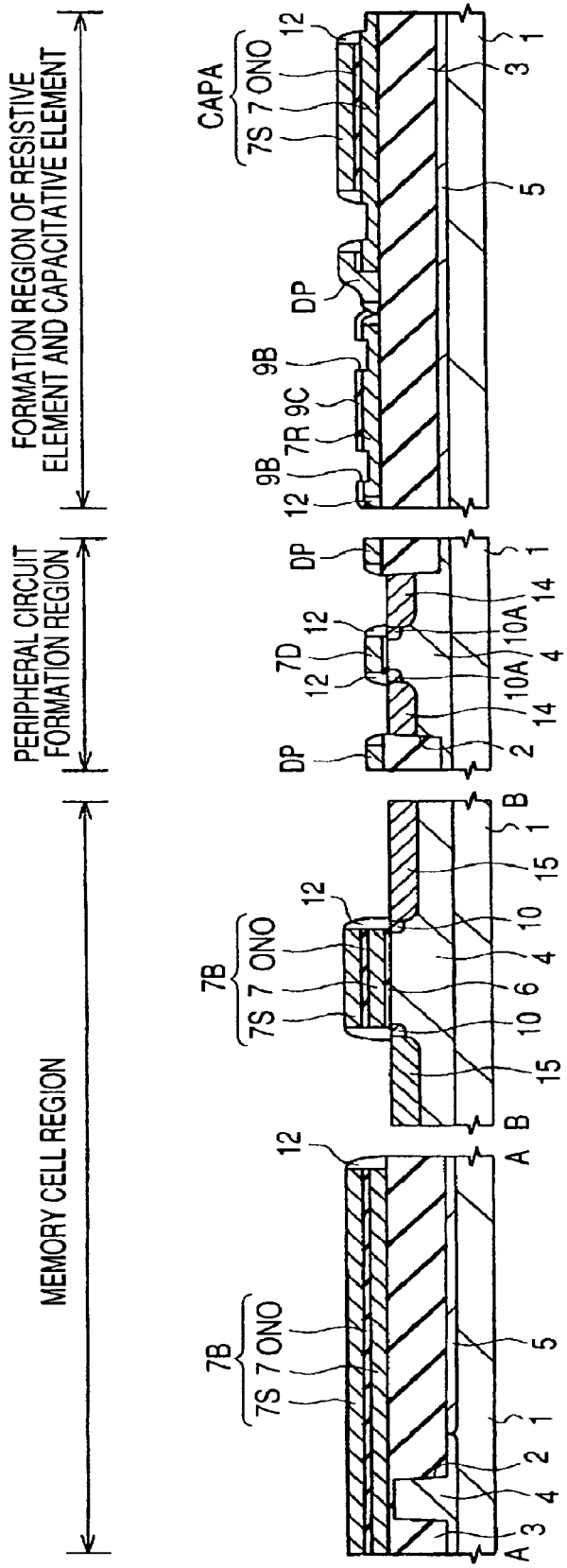
FIG. 45 is a plane view of a relevant part during the manufacturing process of the semiconductor device following FIG. 44.

Next, as shown in FIG. 45, the insulating film 9C is patterned by dry etching using a photoresist film (omitted to be shown) patterned by the photolithography technique as a mask. Thus, the insulating film 9C is left on the resistance element 7R. An opening 9B penetrated to the resistance element 7R is formed in the insulating film 9C on the resistance element 7R.

Figure 46:
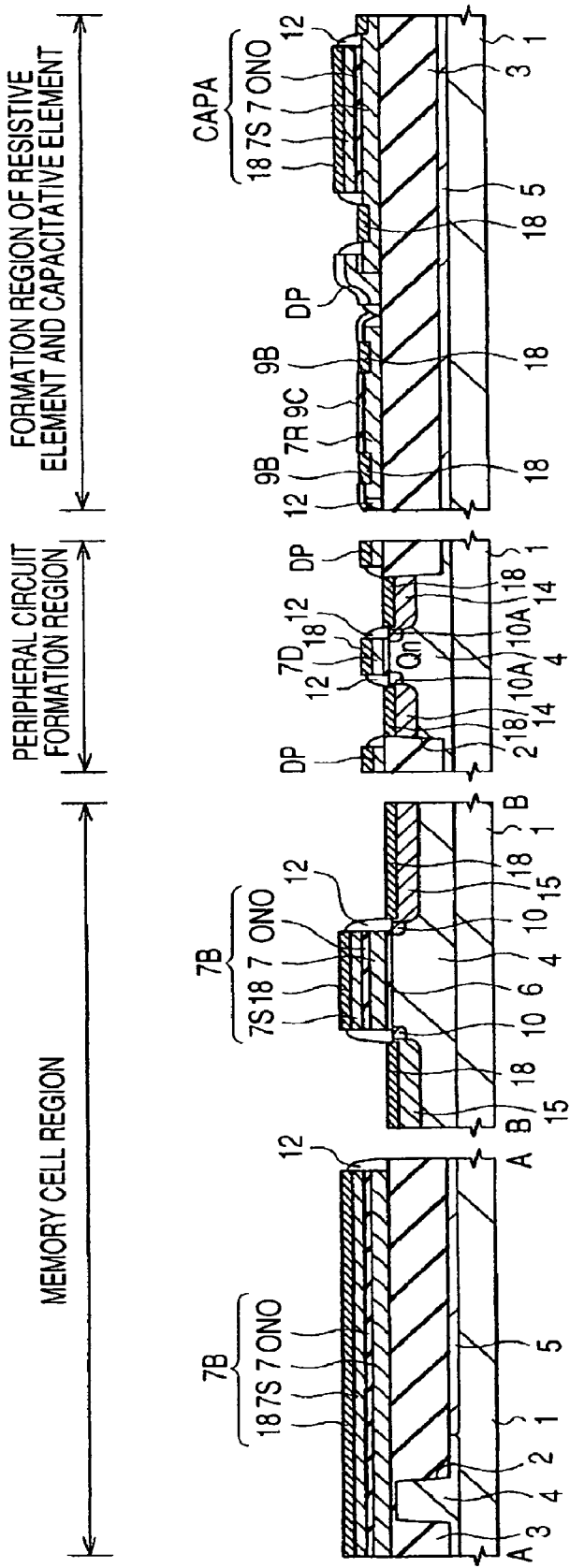
FIG. 46 is a cross section view of a relevant part during the manufacturing process of the semiconductor device following FIG. 45.

Next, as shown in FIG. 46, for example, a Co film is deposited on the substrate 1 by the sputtering process. Then, the substrate 1 is subjected to heat treating to induce a silicide reaction at an interface between the Co film, and the polycrystalline silicon film 7S and the gate electrode 7D, an interface between the Co film and the resistance element 7R on a bottom of the opening 9B, an interface between a polycrystalline silicon film 7 as a lower electrode of the capacitance element CAPA and the Co film, and an interface between the Co film and the substrate 1, then an unreacted Co film is removed by etching. Thus, a silicide layer 18 is formed on surfaces of the polycrystalline silicon film 7S and the gate electrode 7D, a surface of the resistance element 7R on the bottom of the opening 9B, part of a surface of the lower electrode of the capacitance element CAPA, and surfaces of the sources and drains (n$^+$-type semiconductor region 14 and p$^+$-type semiconductor region 15). As a result of steps as above, the MISFETs PM1a (refer to FIG. 1) and PM2a (refer to FIG. 1) forming the nonvolatile memory elements PM1 (refer to FIG. 1) and PM2 (refer to FIG. 1), readout MISFETs DM1 (refer to FIG. 1) and DM2 (refer to FIG. 1), and n-channel MISFETs TR1 to TR4 (refer to FIG. 1) are formed in the memory cell, and a p-channel MISFET and an n-channel MISFET Qn are formed in the peripheral circuit region.

Figure 47:
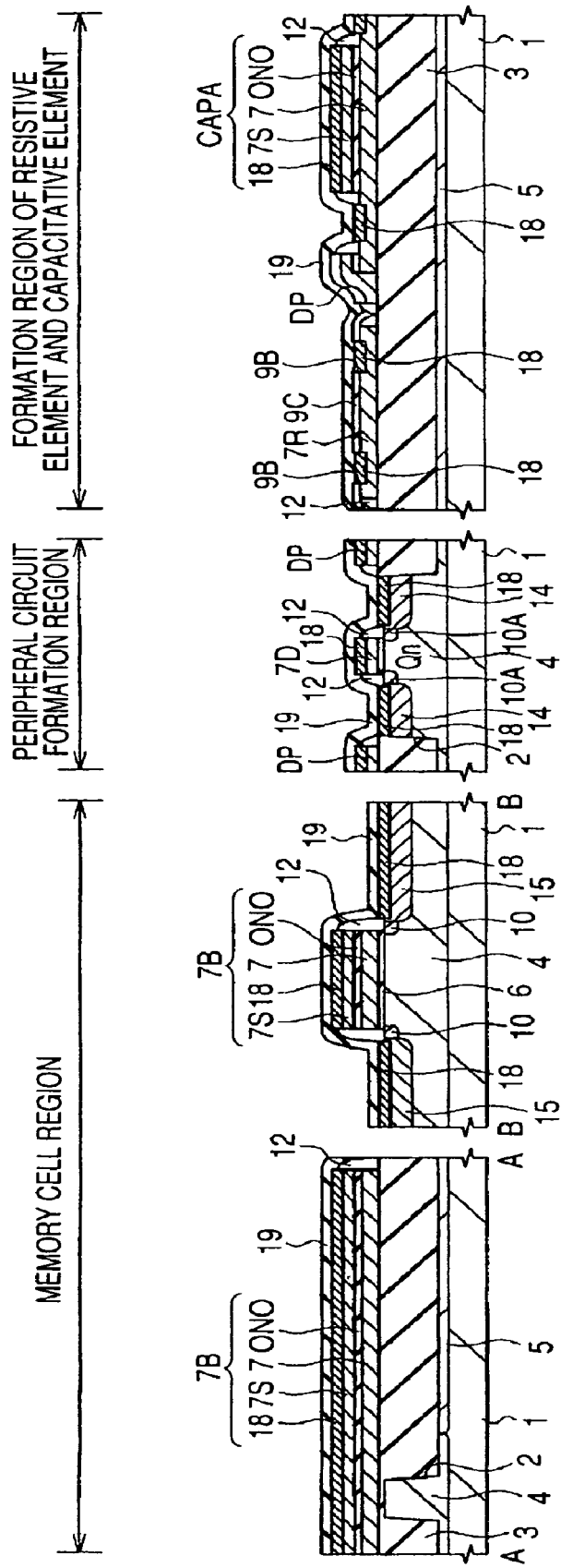
FIG. 47 is a cross section view of a relevant part during the manufacturing process of the semiconductor device following FIG. 46.

Next, as shown in FIG. 47, a silicon nitride film 19 is deposited on the substrate 1 by the plasma enhanced CVD process. Again in the embodiment 3, an approach can be exemplified, in which the silicon nitride film 19 is formed by using a mixture of SiH$_4$ and N$_2$ as deposition gas, and performing plasma decomposition of the mixture.

Figure 48:
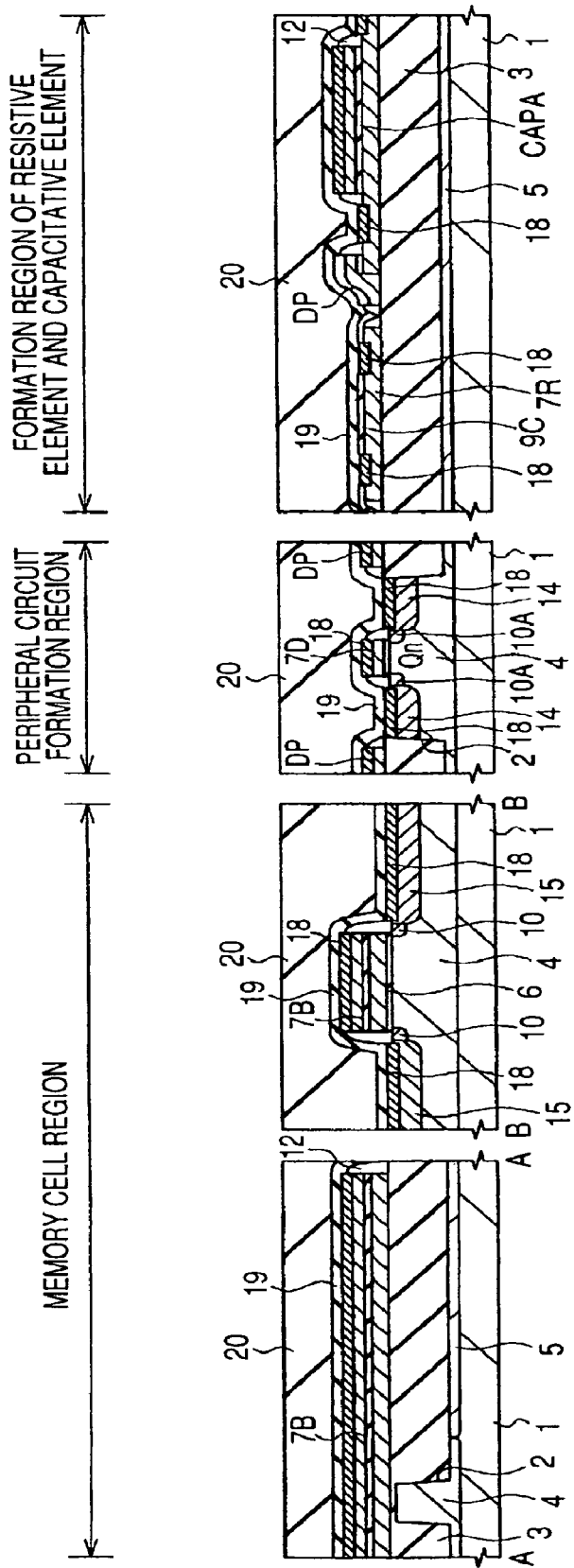
FIG. 48 is a cross section view of a relevant part during the manufacturing process of the semiconductor device following FIG. 47.
Figure 49:
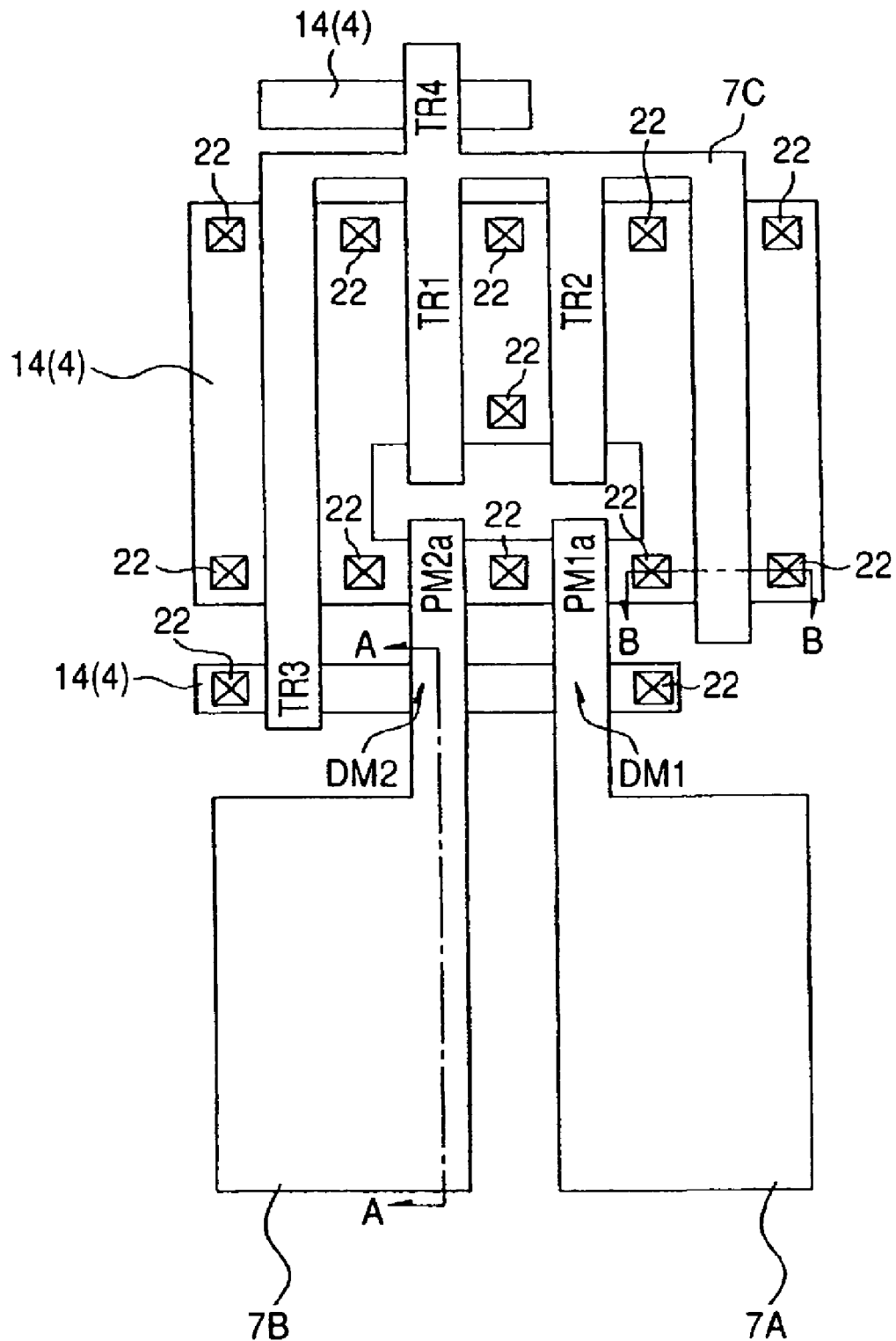
FIG. 49 is a plane view of a relevant part during the manufacturing process of the semiconductor device of the embodiment 3 of the invention.
Figure 50:
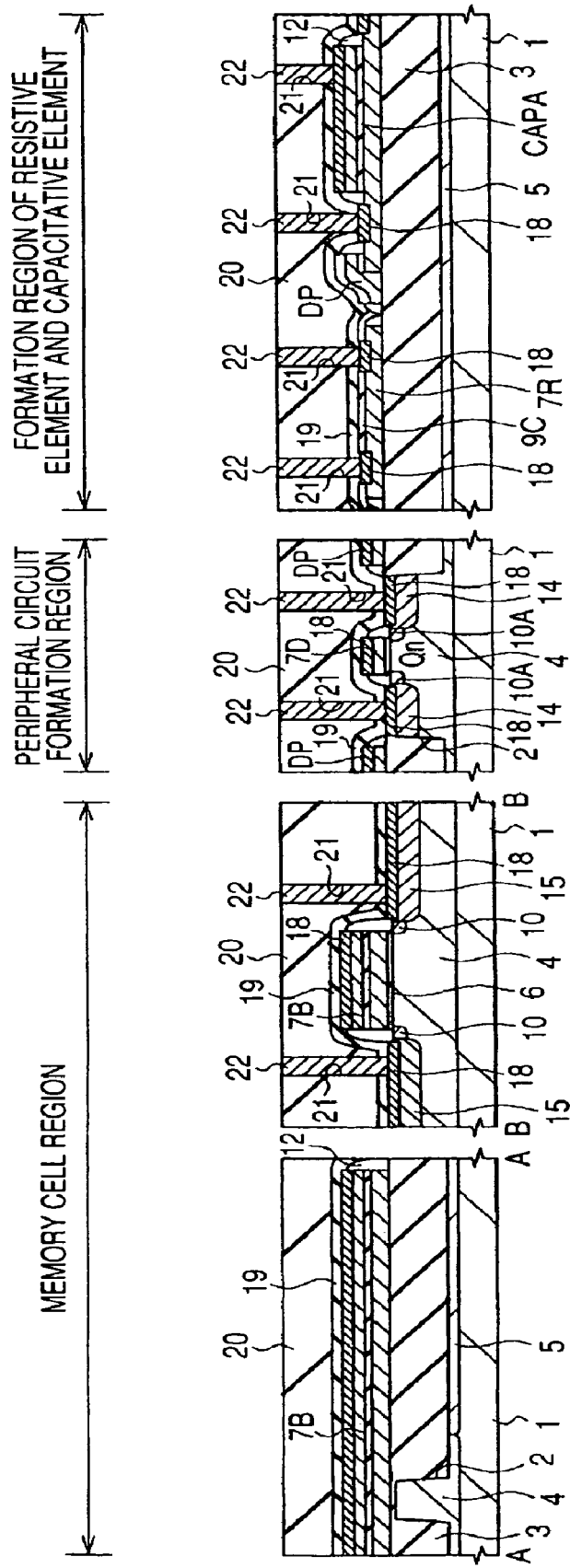
FIG. 50 is a cross section view of a relevant part during the manufacturing process of the semiconductor device following FIG. 48.

Next, as shown in FIG. 48, a silicon oxide film 20 is deposited on the substrate 1 by, for example, the CVD process, then a surface of the silicon oxide film 20 is planarized by the chemical mechanical polishing process. Then, as shown in FIG. 49 and FIG. 50, the silicon oxide film 20 is subjected to dry etching using a photoresist film as a mask, thereby contact holes 21 are formed, which are penetrated to each of the n$^+$-type semiconductor region 14, the p$^+$-type semiconductor region 15, the resistance element 7R, and the resistance element CAPA (upper electrode and lower electrode). Then, plugs 22 similar to the plugs 22 as shown in the embodiment (refer to FIG. 16 and FIG. 17) are formed within the contact holes 21.

Figure 51:
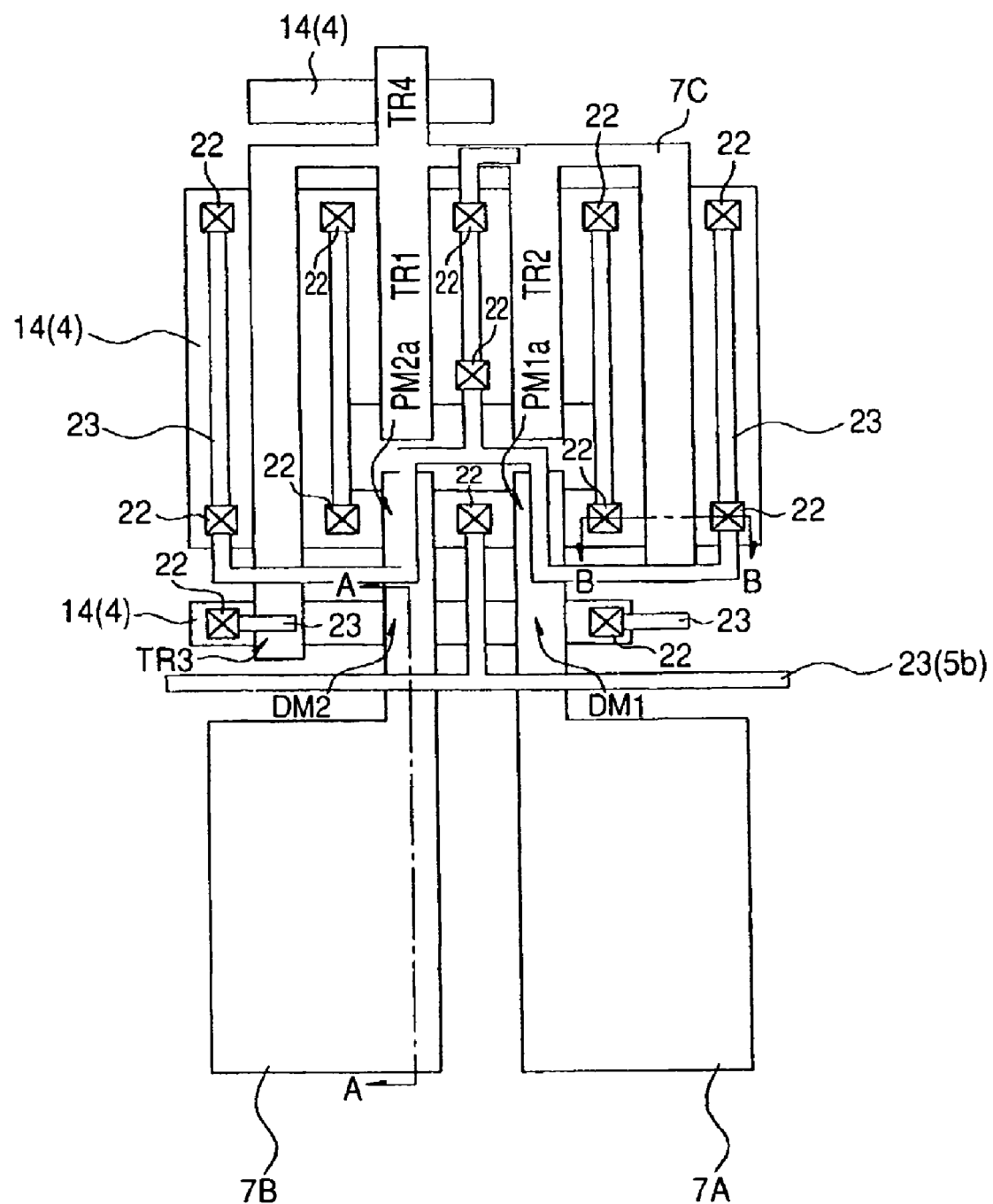
FIG. 51 is a plane view of a relevant part during the manufacturing process of the semiconductor device following FIG. 49.
Figure 52:
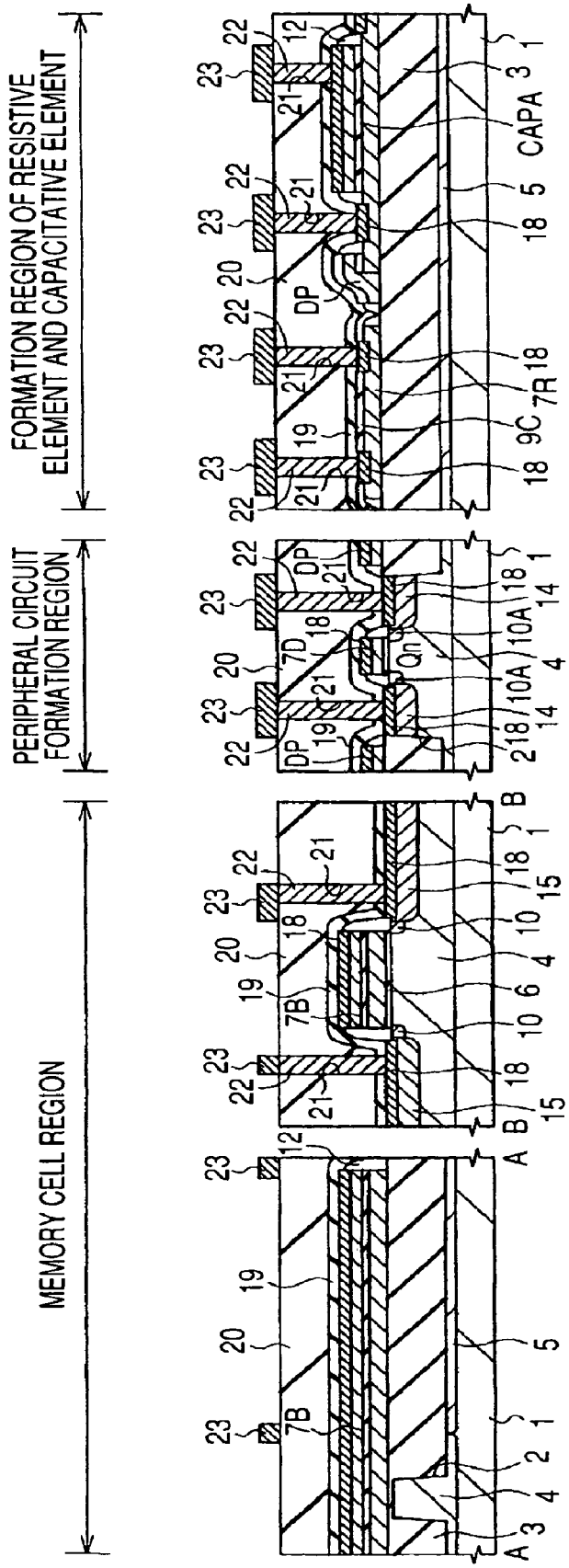
FIG. 52 is a cross section view of a relevant part during the manufacturing process of the semiconductor device following FIG. 50.

Next, as shown in FIG. 51 and FIG. 52, a plurality of wiring lines 23 similar to the wiring lines 23 as shown in the embodiment 1 (refer to FIG. 18 and FIG. 19) are formed on the silicon oxide film 20 and the plugs 22. After that, a semiconductor device of the embodiment 3 is manufactured through the same steps as steps described using FIG. 20 in the embodiment 1.

According to such embodiment 3, the resistance element and the capacitance element can be concurrently formed in the step of forming the MISFETs.

Moreover, according to the embodiment 3, since there is the silicon oxide film (sidewall spacer 12), which is a film that hardly allows leakage of electric charges (highly insulative film) compared with the silicon nitride film 19, between the floating gate (polysilicon silicon film 7) and the silicon nitride film 19 in the memory cell region, reduction in data holding property of the nonvolatile memory as shown in the embodiment 1 can be prevented.

Figure 53:
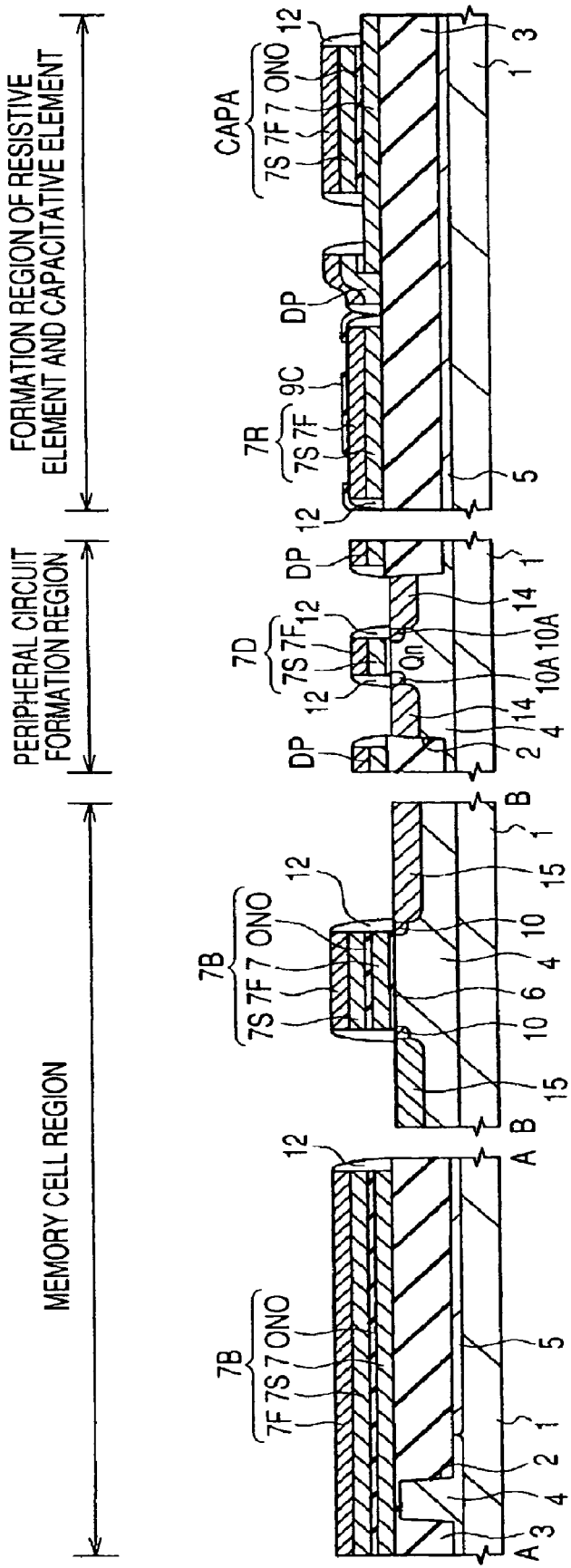
FIG. 53 is a cross section view of a relevant part during the manufacturing process of the semiconductor device of the embodiment 3 of the invention.
Figure 54:
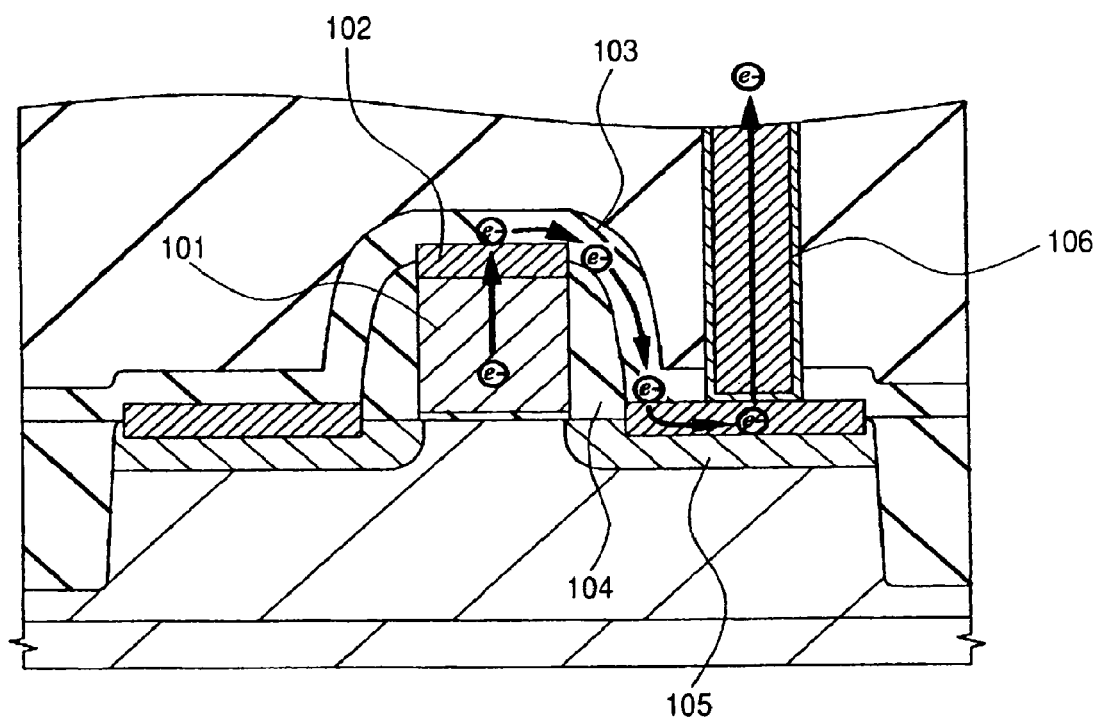
FIG. 54 is a cross section view of a relevant part for explaining a semiconductor device that the inventor investigated.

While the case of forming the gate electrodes 7A, 7B, 7C and 7D including the polycrystalline silicon film 7S, and lower electrodes of the resistance element 7R and the capacitance element CAPA was described in the embodiment 3, they may be formed by stacking WSi films 7F on the polycrystalline silicon films 7S as shown in FIG. 53. In this case, the silicide layers 18 (for example, refer to FIG. 13) may be omitted.

While the invention made by the inventor has been specifically described according to the embodiments hereinbefore, the invention is not limited to the embodiments, and it will be appreciated that the invention can be variously altered or modified within a scope without departing from the gist of the invention.

While the case that a circuit to be relieved is a bad memory cell of DRAM was described in the embodiments, the circuit may be a memory cell of microcomputer-equipped DRAM, or a memory cell of microcomputer-equipped SRAM. Furthermore, a circuit of relieving an LCD driver can be configured.

INDUSTRIAL APPLICABILITY

The semiconductor device and the method of manufacturing the device of the invention can be used, for example, for a semiconductor device having a nonvolatile memory and a method of manufacturing the device.

The invention claimed is:

1. A method of manufacturing a semiconductor device including a nonvolatile memory cell having a first gate electrode over a first region of a semiconductor substrate and a resistance element over a second region of the semiconductor substrate, comprising:
   (a) forming a first conductive film over the first and second regions,
   (b) forming a first insulating film over the first conductive film,
   (c) patterning the first insulating film and the first conductive film so as to form the first gate electrode over the first region while leaving the first insulating film over the first gate electrode and to form the resistance element over the second region while leaving the first insulating film over the resistance element,
   (d) after step (c), depositing a second insulating film over the semiconductor substrate,
   (e) anisotropically etching the first and second insulating films so as to leave the second insulating film over sidewalls of the first gate electrode and the resistance element while removing the first insulating film,
   (f) performing ion implantation of an impurity into the semiconductor substrate so as to form a first semiconductor region in the first region, (g) forming a third insulating film over the semiconductor substrate, after the step (f), and (h) patterning the third insulating film so as to leave the third insulating film over the first gate electrode and over the first insulating film while partially exposing an area over the resistance element, (i) forming a silicide layer over the first semiconductor region and in the partially exposed area over the resistance element, and (j) forming a fourth insulating film over the semiconductor substrate, the fourth insulating film having an etching selectivity ratio different from that of each of the second and third insulating films.

2. The method of manufacturing the semiconductor device according to claim 1:

wherein the second insulating film and the third insulating film are mostly comprised of silicon oxide, and the fourth insulating film is mostly comprised of silicon nitride.

3. The method of manufacturing the semiconductor device according to claim 2:

wherein the fourth insulating film is formed by a plasma enhanced CVD process.

4. A method of manufacturing a semiconductor device, comprising:

(a) forming a first conductive film over a first region, a second region, and a third region of a semiconductor substrate, (b) patterning the first conductive film so as to leave the first conductive film over the first to third regions, (c) after step (b), depositing a first insulating film over the semiconductor substrate, (d) anisotropically etching the first insulating film so as to leave the first insulating film over sidewalls of the first conductive film over the first to third regions, (e) selectively performing ion implantation of an impurity into the semiconductor substrate so as to form a first semiconductor region in the first region, (f) selectively performing ion implantation of an impurity into the semiconductor substrate so as to form a second semiconductor region in the third region, (g) after steps (e) and (f), forming a second insulating film over the semiconductor substrate, (h) selectively patterning the second insulating film so as to partially expose an area over the first semiconductor region while leaving the second insulating film over the first conductive film and the first insulating film over the first region, partially exposing the first conductive film over the second region, exposing the first conductive film over the third region, and exposing an area over the second semiconductor region, (i) forming a silicide layer in the partially exposed area over the first semiconductor region, over the partially exposed first conductive film over the second region, over the exposed first conductive film over the third region, and in the exposed area over the second semiconductor region, and (j) after step (i), forming a third insulating film over the semiconductor substrate.

5. The method of manufacturing a semiconductor device according to claim 4, further comprising:

(k) forming a fourth insulating film over the third insulating film, and (l) selectively etching the third and fourth insulating films so as to form contact holes;

wherein the third insulating film acts as an etching stopper for etching of the fourth insulating film.

6. The method of manufacturing a semiconductor device according to claim 4:

wherein, in step (i) the silicide layer is not formed on the first conductive film over the first region.

7. The method of manufacturing a semiconductor device according to claim 4:

wherein the third insulating film is formed by a plasma enhanced CVD process.

8. The method of manufacturing a semiconductor device according to claim 4:

wherein the first insulating film and the second insulating film are mostly comprised of silicon oxide.

9. The method of manufacturing a semiconductor device according to claim 8:

wherein the third insulating film is mostly comprised of silicon nitride.

10. The method of manufacturing a semiconductor device according to claim 4:

wherein the steps (e) and (f) are performed at the same time.

11. The method of manufacturing a semiconductor device according to claim 10:

wherein the first semiconductor region and the second semiconductor region exhibit n-type conductivity.

12. The method of manufacturing a semiconductor device according to claim 10:

wherein the first semiconductor region and the second semiconductor region exhibit p-type conductivity.

13. The method of manufacturing a semiconductor device according to claim 4:

wherein the step (e) is performed separately from the step (f).

14. The method of manufacturing a semiconductor device according to claim 13:

wherein the first semiconductor region exhibits n-type conductivity, and the second semiconductor region exhibits p-type conductivity.

15. The method of manufacturing a semiconductor device according to claim 13:

wherein the first semiconductor region exhibits p-type conductivity, and the second semiconductor region exhibits n-type conductivity.

* * * * *